United States Patent
Son et al.

(10) Patent No.: US 8,802,246 B2
(45) Date of Patent: Aug. 12, 2014

(54) LIGHT EMITTING POLYMER COMPRISING PHOSPHORESCENCE UNIT AND FLUORESCENCE UNIT AND ORGANIC LIGHT EMITTING DEVICE COMPRISING THE LIGHT EMITTING POLYMER

(75) Inventors: Jhun-Mo Son, Yongin-si (KR); Young-Hun Byun, Yongin-si (KR); Yu-Jin Kim, Yongin-si (KR); O-Hyun Kwon, Yongin-si (KR); Young-Mok Son, Yongin-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 1010 days.

(21) Appl. No.: 11/976,067

(22) Filed: Oct. 19, 2007

(65) Prior Publication Data

US 2008/0169756 A1 Jul. 17, 2008

(30) Foreign Application Priority Data

Jan. 17, 2007 (KR) .................. 10-2007-0005439

(51) Int. Cl.
*H01L 51/54* (2006.01)

(52) U.S. Cl.
USPC ........... 428/690; 428/917; 313/504; 313/505; 313/506; 257/40; 257/E51.05; 257/E51.026; 257/E51.032; 528/9; 528/395; 548/108

(58) Field of Classification Search
USPC ............. 428/690, 917; 257/40, E51.05, 257/E51.026, E51.032; 313/504, 505, 506; 548/108; 528/9, 395
See application file for complete search history.

(56) References Cited

U.S. PATENT DOCUMENTS

| | | | |
|---|---|---|---|
| 2005/0244674 A1* | 11/2005 | Yasuda et al. ............ | 428/690 |
| 2006/0093852 A1* | 5/2006 | Marsitzky et al. ........ | 428/690 |
| 2010/0283038 A1 | 11/2010 | Sekine et al. | |

FOREIGN PATENT DOCUMENTS

| | | |
|---|---|---|
| CN | 1671819 A | 9/2005 |
| JP | 2005-528508 A | 9/2005 |
| JP | 2005-350415 A | 12/2005 |
| JP | 2007-70619 A | 3/2007 |
| KR | 10-2004-0059304 | 7/2004 |

OTHER PUBLICATIONS

Yoshiyuki Kuwabara et al., "Thermally Stable Multilayered Organic Electrolunimescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDATA), as Hole-Transport Materials", Adv. Mater. 1994, 6, No. 9, pp. 677-679.

S. Sprouse et al., "Photophysical Effects of Metal-Carbon σ Bonds in Ortho-Metalated Complexes of Ir(III) and Rh(III)", J. Am. Chem. Soc. 1984, 106, 6647-6653.

Baldo et al., "Highly Efficient Phosphorescent Emission From Organic Electroluminescent Devices," Nature, vol. 395, Sep. 10, 1998, pp. 151-154.

(Continued)

*Primary Examiner* — Gregory Clark
(74) *Attorney, Agent, or Firm* — Robert E. Bushnell, Esq.

(57) ABSTRACT

A light emitting polymer includes a phosphorescence unit and a fluorescence unit. An organic light emitting device includes the light emitting polymer. The light emitting polymer can emit light of two or more colors according to a phosphorescent and fluorescent mechanisms, and thus the organic light emitting device including the light emitting polymer can have long lifetime, high brightness and excellent efficiency, and emit white light.

5 Claims, 5 Drawing Sheets

(56) References Cited

OTHER PUBLICATIONS

Sprouse et al.,"Photophysical Effects of Metal-Carbon σ,Bonds in Ortho-Metalated Complexes of Ir(III) and Rh(III)" Journal of American Chemical Society, vol. 106, No. 22, 1984, pp. 6647-6653.

Japanese Office Action dated May 7, 2013 in corresponding Japanese Patent Application No. 2008-008303 and Request for Entry of the Accompanying Office Action attached herewith.

Chinese Office Action issued by Chinese Patent Office on Dec. 4, 2013 in connection with Chinese Patent Application No. 200810003304.8 which also claims Korean Patent Application No. 10-2007-0005439 as its priority document and Request for Entry of the Accompanying Office Action attached herewith.

* cited by examiner

COLOR PURITY

LIGHT EMITTING POLYMER COMPRISING PHOSPHORESCENCE UNIT AND FLUORESCENCE UNIT AND ORGANIC LIGHT EMITTING DEVICE COMPRISING THE LIGHT EMITTING POLYMER

CROSS-REFERENCE TO RELATED PATENT APPLICATION AND CLAIM OF PRIORITY

This application claims the benefit of Korean Patent Application No. 10-2007-0005439, filed on Jan. 17, 2007, in the Korean Intellectual Property Office, the disclosure of which is incorporated herein in its entirety by reference.

BACKGROUND OF THE INVENTION

1. Field of the Invention

The present invention relates to a light emitting polymer and an organic light emitting device, and more particularly to a light emitting polymer including a phosphorescence unit and a fluorescence unit, and an organic light emitting device including the light emitting polymer.

2. Description of the Related Art

Organic light emitting devices which include a pair of electrodes and an organic layer interposed between the electrodes are self-emission displays that emit light due to the recombination of electrons and holes in the organic layer when a current is applied to the electrodes. The organic light emitting devices have advantages such as being lightweight, and having simple constitutional elements, a simple fabrication process, a superior image quality, and a wide viewing angle. Furthermore, the organic light emitting devices can display high quality dynamic images and have high color purity, and also have electrical properties suitable for use in portable electronic equipment such as low power consumption and low driving voltage.

Generally, organic light emitting devices include: an anode on a substrate; a hole transport layer, an emissive layer, an electron transport layer, etc. as organic layers on the anode; and a cathode on the organic layers.

When a current is applied between the anode and the cathode, holes injected from the anode are transported to the emissive layer through the hole transport layer, and electrons injected from the cathode are transported to the emissive layer through the electron transport layer. The transported holes and electrons recombine in the emissive layer to form excitons. A radiative decay of the excitons is induced to emit light having a wavelength corresponding to a band gap of the excitons.

Compounds that are used to form an emissive layer of an organic light emitting device are classified into a fluorescent compound using singlet excitons and a phosphorescent compound using triplet excitons according to light emitting mechanisms. The emissive layer can be formed using a fluorescent compound or a phosphorescent compound, or by doping the fluorescent compound or the phosphorescent compound on an appropriate host. When the emissive layer is formed using the fluorescent or phosphorescent compounds with the host, singlet excitons and triplet excitons are formed on the host as a result of electron excitation. The ratio of the singlet excitons to the triplet excitons is 1:3.

When a fluorescent compound is used to form an emissive layer in an organic light emitting device, it has the disadvantage that triplet excitons generated in a host are wasted, however when a phosphorescent compound is used to form an emissive layer, it has the advantage that an internal quantum efficiency reaches 100% since both of singlet excitons and triplet excitons are used (Baldo, et al., Nature, Vol.395, 151-154, 1998). Thus, an emissive layer formed of a phosphorescent compound has higher light emitting efficiency than that formed of a fluorescent compound.

Examples of the phosphorescent compound may include an organic complex compound complexed with a heavy metal such as Ir, Pt, Rh, and Pd. When a heavy metal is introduced into an organic molecule, triplet excitons and singlet excitons are mixed by a spin-orbital coupling generated by a heavy atom effect. Thus, transition which was originally prohibited can occur, and thus phosphorescence can effectively occur at room temperature. An example of the phosphorescent compound is disclosed in Korean Patent Publication No. 2004-0059304.

Various compounds using a transition metal compound including iridium, platinum, etc. as a high efficiency emissive material using phosphorescence have been reported. However, characteristics such as long lifetime and light emitting efficiency are not satisfactory for application in highly-efficient full color displays or low power consumption white light emission. Particularly, color purity and lifetime of blue light emitting materials need to be improved compared to green and red light emitting materials.

SUMMARY OF THE INVENTION

The present invention provides a light emitting polymer.

According to an aspect of the present invention, a light emitting polymer provides excellent color purity, luminance and efficiency.

According to an aspect of the present invention, there is provided a light emitting polymer including a phosphorescence unit and a fluorescence unit.

The present invention provides an improved organic light emitting device.

According to another aspect of the present invention, there is provided an organic light emitting device including the emitting polymer interposed between a pair of electrodes.

The light emitting polymer may be represented by Formula 1 below.

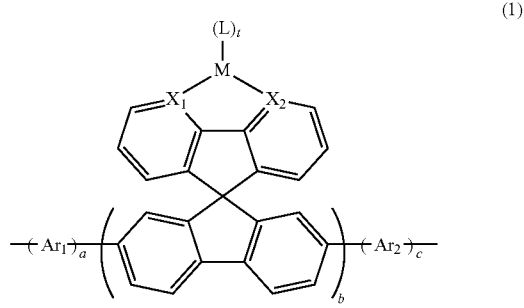

where $X_1$ and $X_2$ are each independently N or C, and at least one of $X_1$ and $X_2$ is N;

M is a bivalent to tetravalent metal atom;

L is an organic ligand;

t is 1 or 2;

$Ar_1$ and $Ar_2$ are each independently a substituted or unsubstituted $C_6$-$C_{30}$ arylene group or a substituted or unsubstituted $C_4$-$C_{20}$ heteroarylene group; and a and b are each a real number of 0.01 to 0.99, c is a real number of 0 to 0.99, and a+b+c=1.

The light emitting polymer can emit light of two or more colors according to phosphorescent and fluorescent mechanisms, and thus an organic light emitting device including the light emitting polymer can have long lifetime, excellent efficiency, and high luminance, etc. and emit white light.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
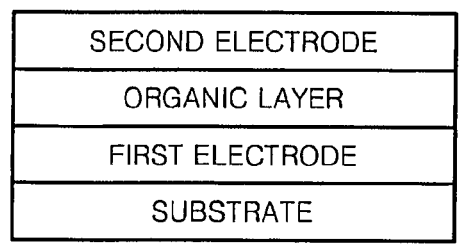
FIG. 1 is a schematic diagram illustrating an organic light emitting device according to an embodiment of the present invention.

Hereinafter, the present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

A light emitting polymer according to an embodiment of the present invention includes a phosphorescence unit and a fluorescence unit.

The phosphorescence unit is a moiety capable of emitting light by a phosphorescent mechanism. That is, triplet excitons are generated in the phosphorescence unit, and thus light can be emitted using the triplet excitons. The fluorescence unit is a moiety capable of emitting light by a fluorescent mechanism. The light emitting polymer according to an embodiment of the present invention can have high luminance, excellent efficiency, and long lifetime since phosphorescent and fluorescent emissions simultaneously occur in one polymer and thus high internal quantum efficiency can be achieved.

Further, the light emitting polymer may simultaneously emit at least two colors since it includes the phosphorescence unit and the fluorescence unit. For example, the phosphorescence unit can emit red or green light, or simultaneously emit red and green light. In addition, the fluorescence unit can emit blue light, but the colors are not limited thereto.

As described above, the light emitting polymer can emit at least two colors at the same time, and thus emit white light according to a combination of at least two colors.

The phosphorescence unit may be an aromatic or hetero aromatic unit containing a metal complex. The metal may be Ir, Pt, Rh, Pd, Os, Ti, Zr, Hf, Eu, Tb, and Tm which can simultaneously generate triplet excitons and singlet excitons through a spin-orbital coupling generated from a heavy atom effect.

The light emitting polymer according to an embodiment of the present invention may be represented by Formula 1 below.

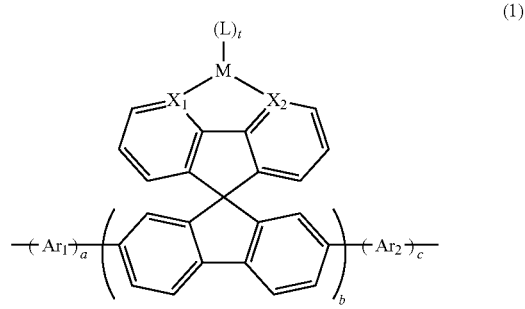

(1)

Here, a unit represented by Formula 2A included in Formula 1 may be a red or green phosphorescence unit:

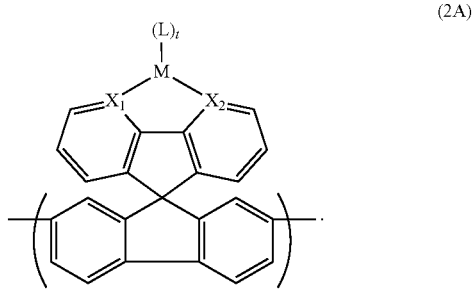

(2A)

Furthermore, units represented by $Ar_1$ and $Ar_2$ in Formula 1 may be blue fluorescence units.

Accordingly, the light emitting polymer represented by Formula 1 may emit red and blue light at the same time or green and blue light at the same time. Thus the light emitting polymer may emit white light.

In Formula 1, $X_1$ and $X_2$ are each independently N or C, and at least one of $X_1$ and $X_2$ is N.

In Formula 1, M may be a bivalent to tetravalent metal atom. More particularly, M may be Ir, Pt, Rh, Pd, Os, Ti, Zr, Hf, Eu, Tb or Tm, but is not limited thereto.

In Formula 1, L is an organic ligand. L may be a ligand which can be coordinated with M and represented by Formula 2B:

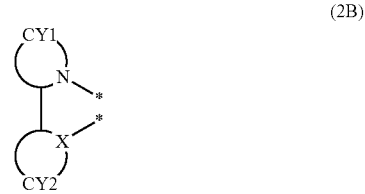

(2B)

where CY1 is an aromatic or aliphatic ring having a nitrogen atom, which is bonded to M of Formula 1;

CY2 is an aromatic or aliphatic ring having an X atom, which is bonded to M of Formula 1, and X is C, S, O or N; and

*is a site at which M is bonded.

More particularly, L may have at least one of the structures represented by Formulae 3A through 3X:
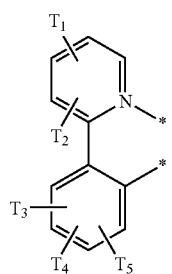
3A
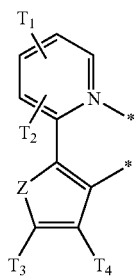
3B
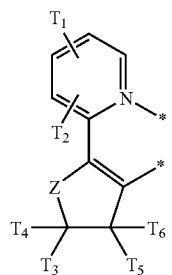
3C
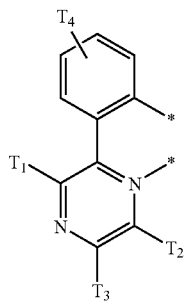
3D
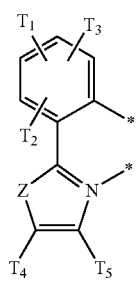
3E
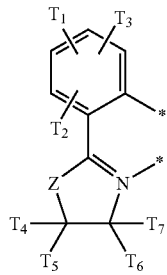
3F
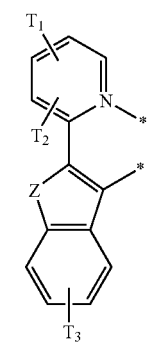
3G
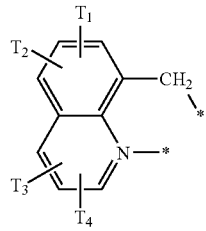
3H
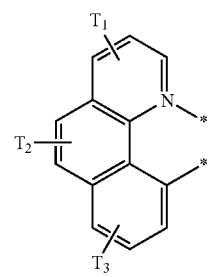
3I
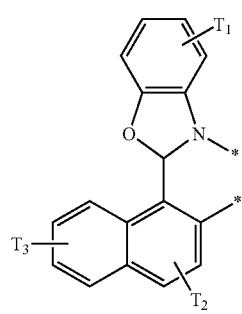
3J -continued
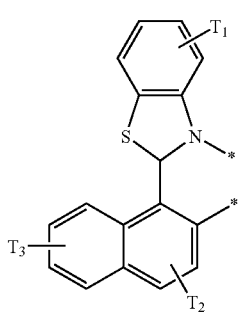
3K
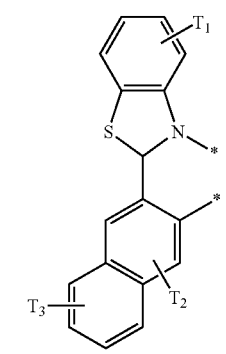
3L
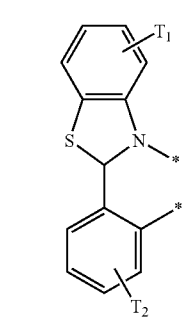
3M
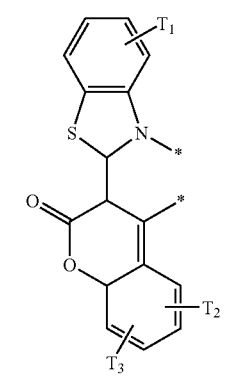
3N
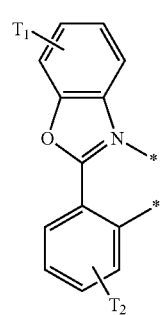
3O
-continued
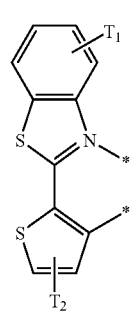
3P
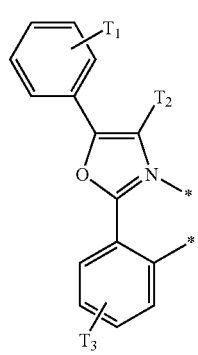
3Q
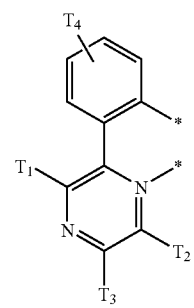
3R
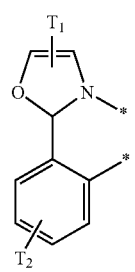
3S
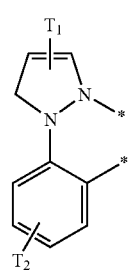
3T -continued

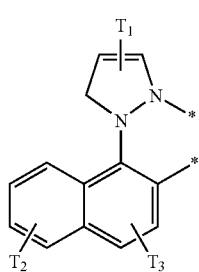
3U

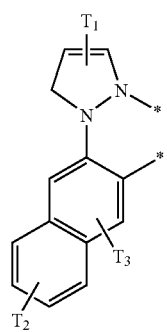
3V

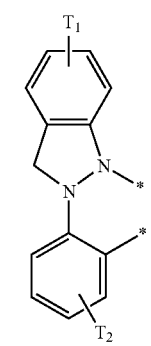
3W

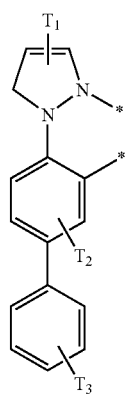
3X where Z is S, O or $NT_8$;

$T_1$, $T_2$, $T_3$, $T_4$, $T_5$, $T_6$, $T_7$ and $T_8$ are each independently a hydrogen atom, a halogen atom, —$CF_3$, —CN, —$Si(A_1)(A_2)(A_3)$, a substituted or unsubstituted $C_1$-$C_{12}$ alkyl group, a substituted or unsubstituted $C_2$-$C_{12}$ alkenyl group, a substituted or unsubstituted $C_6$-$C_{20}$ aryl group, a substituted or unsubstituted $C_1$-$C_{12}$ alkoxy group, a substituted or unsubstituted $C_6$-$C_{20}$ aryloxy group or an amino group, and, alternatively, at least two of $T_1$, $T_2$, $T_3$, $T_4$, $T_5$, $T_6$, $T_7$ and $T_8$ may be fused to form a 5-membered to 7-membered aliphatic or aromatic ring;

$A_1$, $A_2$ and $A_3$ are each independently a hydrogen atom, a substituted or unsubstituted $C_1$-$C_{12}$ alkyl group, a substituted or unsubstituted $C_2$-$C_{12}$ alkenyl group or a substituted or unsubstituted $C_1$-$C_{12}$ alkoxy group; and

*is a site at which M is bonded.

According to an embodiment of the present invention, L may have at least one of the structures represented by Formulas 4A and 4B, but is not limited thereto.

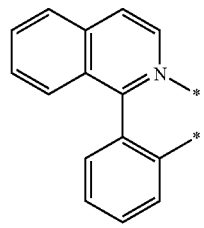
(4A)

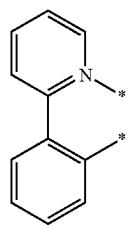
(4B)

In Formulas 4A and 4B, * is a site at which M is bonded.

In Formula 1, t is 1 or 2.

In Formula 1, $Ar_1$ and $Ar_2$ may be each independently a substituted or unsubstituted $C_6$-$C_{30}$ arylene group or a substituted or unsubstituted $C_4$-$C_{20}$ heteroarylene group.

At least one of the hydrogen atoms in $Ar_1$ and $Ar_2$ may be substituted with a cyano group, a hydroxy group, a thiol group, a nitro group, a halogen atom, a substituted or unsubstituted $C_1$-$C_{20}$ alkyl group, a substituted or unsubstituted $C_1$-$C_{20}$ alkoxy group, a substituted or unsubstituted $C_2$-$C_{20}$ alkenyl group, a substituted or unsubstituted $C_6$-$C_{30}$ aryl group, a substituted or unsubstituted $C_6$-$C_{30}$ aryloxy group, a substituted or unsubstituted $C_2$-$C_{30}$ heteroaryl group, a substituted or unsubstituted $C_2$-$C_{30}$ heteroaryloxy group, a substituted or unsubstituted $C_5$-$C_{30}$ cycloalkyl group, a substituted or unsubstituted $C_2$-$C_{30}$ heterocycloalkyl group, or —$N(Z_1)(Z_2)$, wherein $Z_1$ and $Z_2$ are each independently a hydrogen atom or a $C_1$-$C_{12}$ alkyl group.

More particularly, $Ar_1$ and $Ar_2$ in Formula 1 may be at least one of the structures represented by Formulae 5A through 5T and 6.

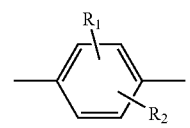
5A

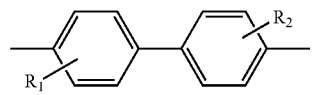
5B

-continued
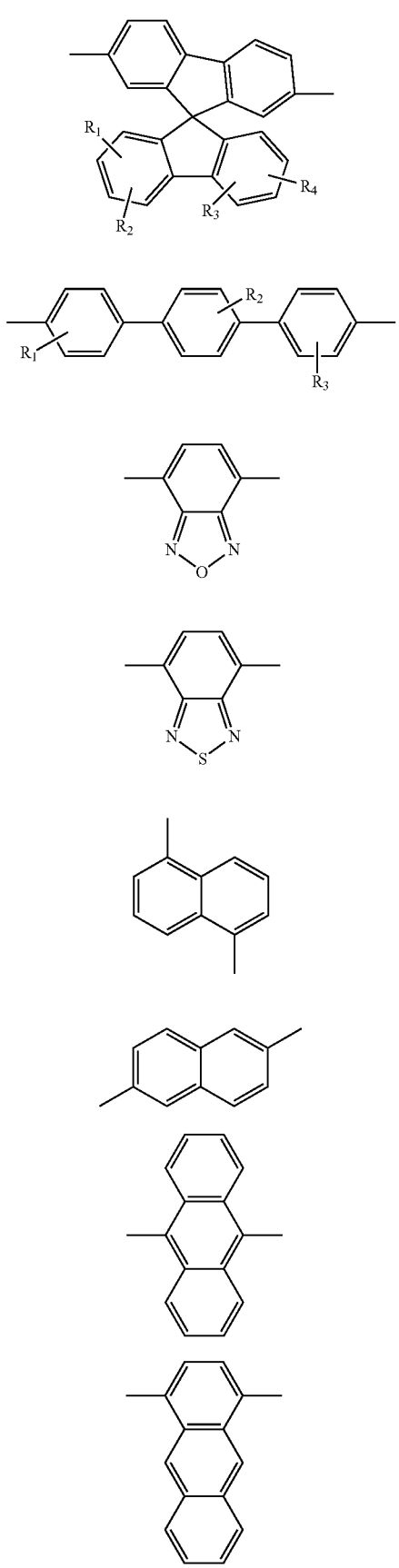
-continued
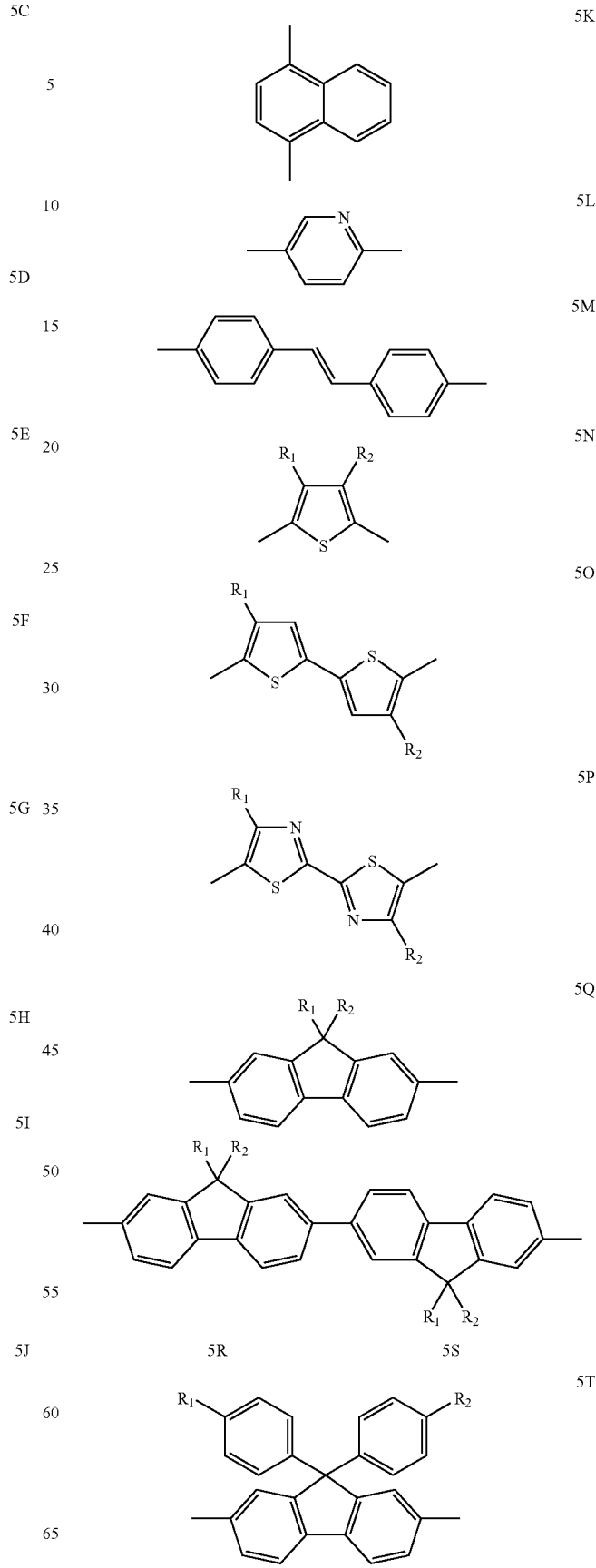

-continued

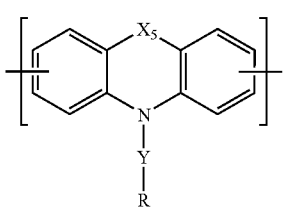

(6)

In Formulae 5A through 5T and 6, $R_1$, $R_2$, $R_3$ and $R_4$ may be each independently a hydrogen atom, a substituted or unsubstituted $C_1$-$C_{12}$ alkyl group, a substituted or unsubstituted $C_1$-$C_{12}$ alkoxy group, or a substituted or unsubstituted $C_6$-$C_{20}$ aryl group. At least one of the hydrogen atoms in the $C_6$-$C_{20}$ aryl group may be unsubstituted, or substituted with a $C_1$-$C_{12}$ alkyl group, a $C_1$-$C_{12}$ alkoxy group or —N($Z_1$)($Z_2$), wherein $Z_1$ and $Z_2$ are each independently a hydrogen atom or a $C_1$-$C_{12}$ alkyl group.

$X_5$ may be O, S,

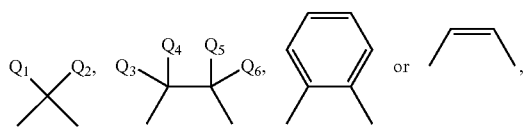

wherein $Q_1$, $Q_2$, $Q_3$, $Q_4$, $Q_5$ and $Q_6$ may be each independently a hydrogen atom, a substituted or unsubstituted $C_1$-$C_{20}$ alkyl group (preferably a $C_1$-$C_{12}$ alkyl group) or a $C_1$-$C_{20}$ alkoxy group (preferably a $C_1$-$C_{12}$ alkoxy group).

In Formulae 5A through 5T and 6, Y may be a substituted or unsubstituted $C_6$-$C_{20}$ arylene group. For example, Y may be a phenylene group, a naphthalene group, or an anthracene group, but is not limited thereto.

In Formulae 5A through 5T and 6, R may be a hydrogen atom, a substituted or unsubstituted $C_1$-$C_{20}$ alkyl group (preferably a $C_1$-$C_{12}$ alkyl group), a substituted or unsubstituted $C_1$-$C_{20}$ alkoxy group (preferably a $C_1$-$C_{12}$ alkoxy group), a substituted or unsubstituted $C_3$-$C_{30}$ cycloalkyl group (preferably a $C_3$-$C_{12}$ cycloalkyl group), a substituted or unsubstituted $C_6$-$C_{30}$ aryl group (preferably a $C_6$-$C_{14}$ aryl group) or a substituted or unsubstituted $C_6$-$C_{30}$ heteroaryl group (preferably, a $C_6$-$C_{14}$ heteroaryl group). Here, at least one hydrogen atom in the aryl group or heteroaryl group may be substituted with a $C_1$-$C_{12}$ alkyl group, a $C_1$-$C_{12}$ alkoxy group or —N($Z_1$)($Z_2$), wherein $Z_1$ and $Z_2$ are each independently a hydrogen atom or a $C_1$-$C_{12}$ alkyl group; or may not be substituted.

In Formula 1, a and b may be each a real number of 0.01 to 0.99, c is a real number of 0 to 0.99, and a+b+c=1.

When c is 0, the compound of Formula 1 is represented by Formula 1A:

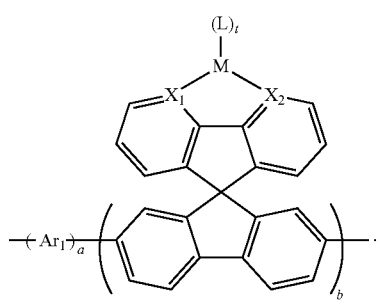

(1A)

In Formula 1A, a and b may be each a real number of 0.01 to 0.99, preferably 0.5 to 0.95, and a+b=1.

A weight average molecular weight of the light emitting polymer may be in the range of 10,000 to 500,000, and preferably 200,000 to 400,000. When the weight average molecular weight of the light emitting polymer is within the range described above, an organic light emitting device including the light emitting polymer may have long lifetime and excellent luminance.

A molecular weight distribution of the light emitting polymer may be in the range of 1.5 to 5, and preferably 2 to 3. When the molecular weight distribution is within the range as described above, an organic layer of an organic light emitting device including the light emitting polymer may have long lifetime, and excellent luminance.

According to an embodiment of the present invention, the light emitting polymer may be represented by Formula 7, 8 or 9, but is not limited thereto.

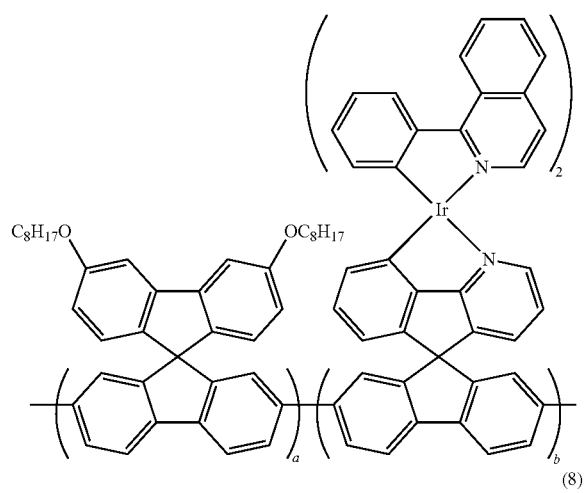

(7)

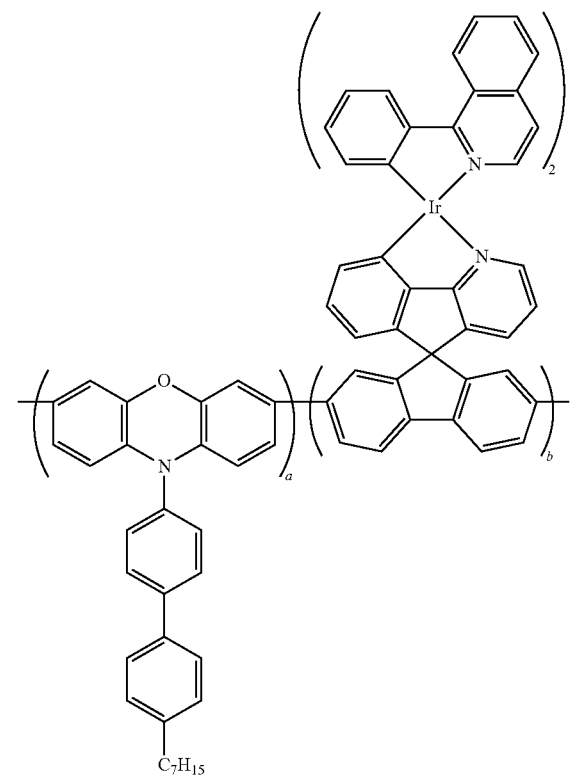

(8)

where a and b are each a real number of 0.01 to 0.99, and a+b=1;

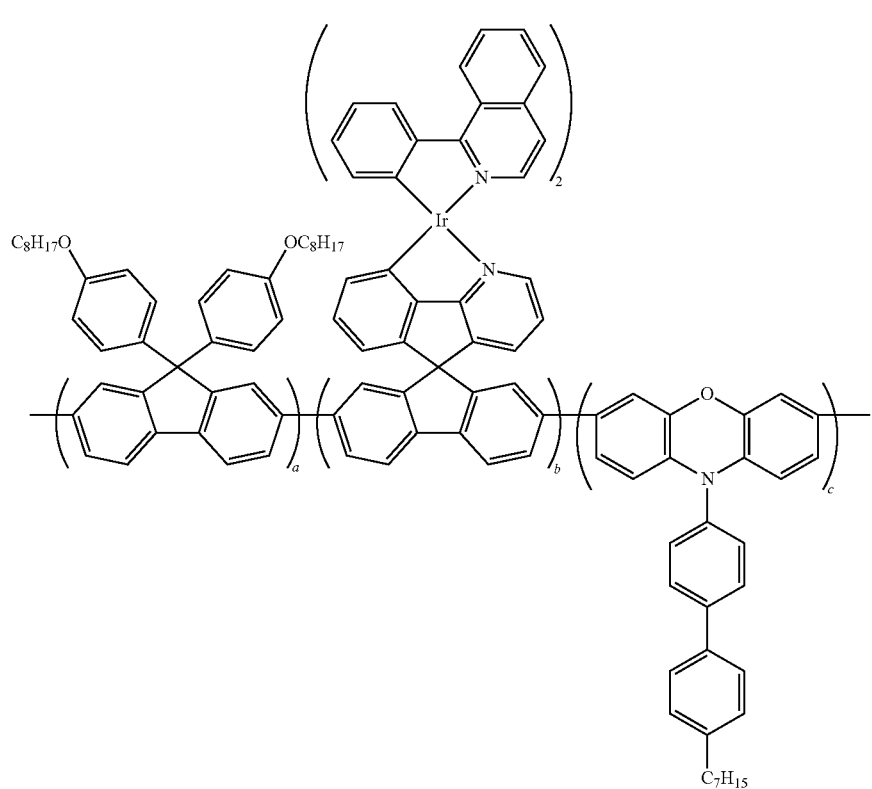
(9)
where a, b and c are each a real number of 0.01 to 0.99, and a+b+c=1.
According to an embodiment of the present invention, the light emitting polymer may be represented by Formula 10, 11 or 12, but is not limited thereto.
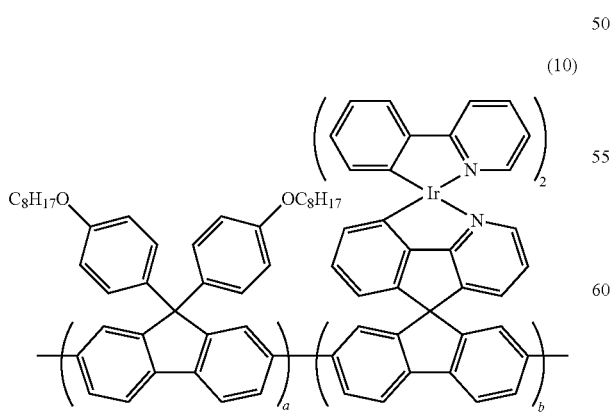
(10)
-continued
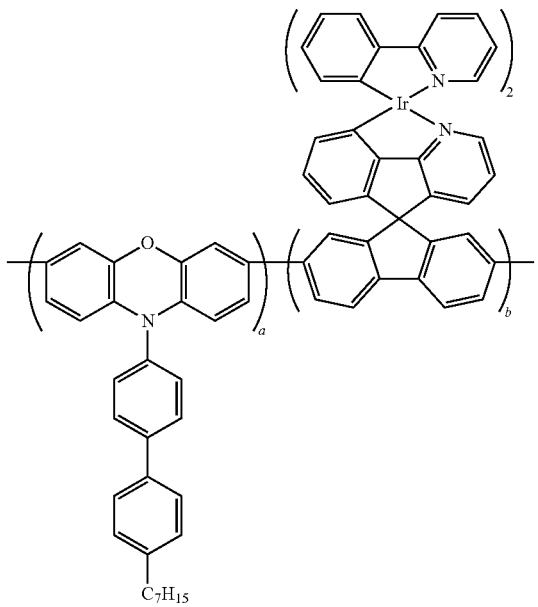
(11)
where a and b are each a real number of 0.01 to 0.99, and a+b=1;

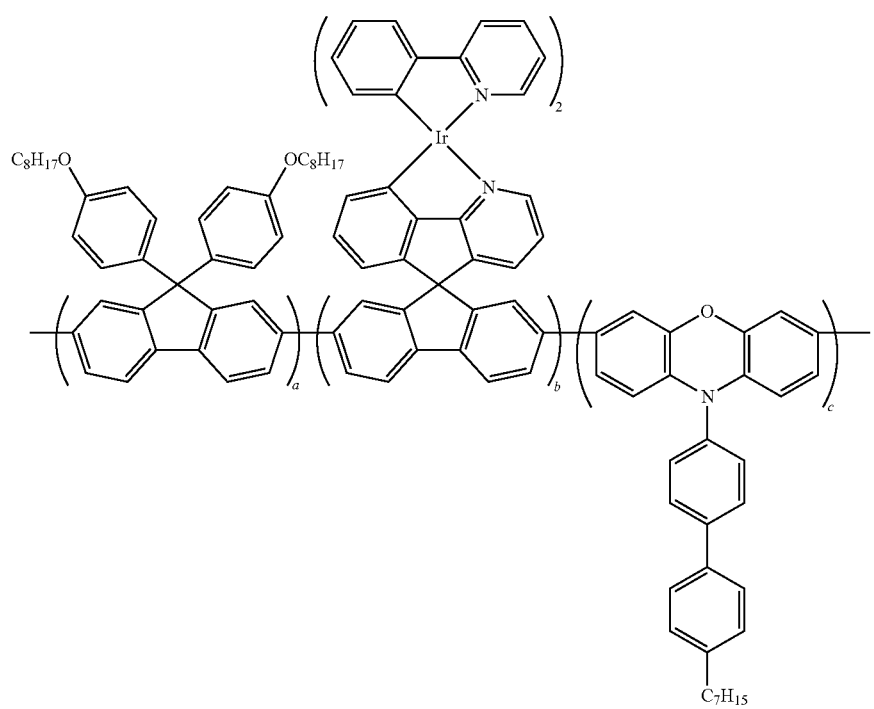

where a, b and c are each a real number of 0.01 to 0.99, and a+b+c=1.

Examples of the unsubstituted $C_1$-$C_{20}$ alkyl group may include a methyl group, an ethyl group, a propyl group, an isobutyl group, a sec-butyl group, a pentyl group, an iso-amyl group and a hexyl group, and at least one hydrogen atom in the $C_1$-$C_{20}$ alkyl group may be substituted with a halogen atom, a $C_1$-$C_{30}$ alkyl group, a $C_1$-$C_{30}$ alkoxy group, a $C_1$-$C_{10}$ alkylamino group, a hydroxyl group, a nitro group, a cyano group, an amino group, an amidino group, hydrazine, hydrazone, a carboxylic acid group, a sulfonic acid group, a phosphoric acid group, or the like.

An example of the unsubstituted $C_2$-$C_{12}$ alkenyl group may be an ethenyl group, and at least one hydrogen atom in the $C_2$-$C_{12}$ alkenyl group may be substituted with the groups described above with reference to the $C_1$-$C_{20}$ alkyl group.

Examples of the unsubstituted $C_1$-$C_{20}$ alkoxy group may be a methoxy group, an ethoxy group, a propoxy group, an isobutyloxy group, a sec-butyloxy group, a pentyloxy group, an iso-amyloxy group, and a hexyloxy group, and at least one hydrogen atom in the $C_1$-$C_{20}$ alkoxy group may be substituted with the groups described above with reference to the $C_1$-$C_{20}$ alkyl group.

The $C_6$-$C_{30}$ aryl group indicates a carbocyclic aromatic system containing one or more rings, wherein such rings may be bonded together in a pendent manner or may be fused. The term "aryl group" may include an aromatic system such as a phenyl group, a naphthyl group, and a tetrahydronaphthyl group. At least one hydrogen atom in the $C_6$-$C_{30}$ aryl group may be substituted with the groups described above with reference to the $C_1$-$C_{20}$ alkyl group.

The $C_2$-$C_{30}$ heteroaryl group indicates a monovalent monocyclic ring compound having one or more rings including 2 to 30 carbon atoms and 1 to 3 hetero atoms selected from the group consisting of N, O, P, and S, wherein such rings may be bonded together in a pendent manner or may be fused. Examples of the $C_2$-$C_{30}$ heteroaryl group may include a pyridyl group, a thienyl group, and a furyl group. At least one hydrogen atom in the $C_2$-$C_{30}$ heteroaryl group may be substituted with the groups described above with reference to the $C_1$-$C_{20}$ alkyl group.

The $C_5$-$C_{30}$ cycloalkyl group is a cyclic alkyl group, for example a cyclohexyl group, and at least one hydrogen atom in the $C_5$-$C_{30}$ cycloalkyl group may be substituted with the groups described above with reference to the $C_1$-$C_{20}$ alkyl group.

The $C_5$-$C_{30}$ heterocycloalkyl group is at least one of C of cycloalkyl group replaced with at least one hetero atoms selected from the group consisting of N, O, P and S, such as a pyrrolidinyl group, and an imidazolidinyl group, and at least one hydrogen atom in the $C_5$-$C_{30}$ heterocycloalkyl group may be substituted with the groups described above with reference to the $C_1$-$C_{20}$ alkyl group.

The light emitting polymer represented by Formula 1 may be synthesized through Reaction Scheme 1 below.

Reaction Scheme 1

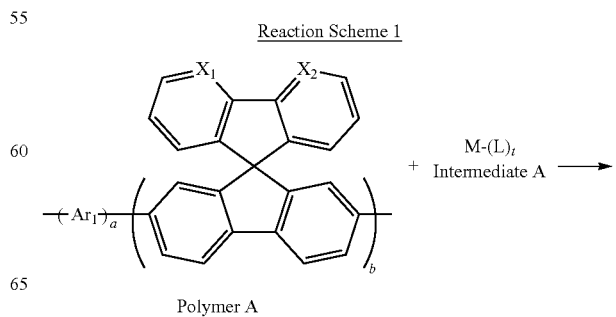

Polymer A

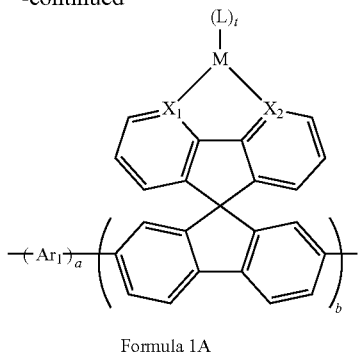

Formula 1A

In Reaction Scheme 1, $Ar_1$, $X_1$, $X_2$, M, L, t, a and b are as described above.

Referring to Reaction Scheme 1, polymer A including a fluorescence unit is synthesized, and polymer A is reacted with intermediate A including metal M and ligand L to prepare the light emitting polymer of Formula 1 having a phosphorescence unit and a fluorescence unit. Other processes of synthesizing the polymer are not limited, and are described in various references in detail, and thus will not be described herein in detail.

The light emitting polymer may be included in an organic layer of an organic light emitting device. An organic light emitting device according to an embodiment of the present invention may include a pair of electrodes and an organic layer interposed between the pair of the electrodes. The organic layer may have the light emitting polymer, and the organic layer having the light emitting polymer may be a light emissive layer.

The light emitting polymer can be used alone, or with a host that is known in the art. Examples of the host may include 4,4'-N,N'-dicarbazole-biphenyl (CBP), and poly(n-vinylcarbazole (PVK), but are not limited thereto.

When the light emitting polymer is used together with a host, the amount of the host may be about 10 to 30 parts by weight based on 100 parts by weight of the light emitting polymer, but is not limited thereto.

An organic light emitting device including an organic layer having the light emitting polymer may have long lifetime, high luminance and excellent efficiency. Further, since the organic light emitting device may emit more than two colors of light, white light can be emitted.

FIG. 1 is a schematic diagram illustrating an organic light emitting device according to an embodiment of the present invention. The organic light emitting device includes a substrate, a first electrode, an emissive layer containing the light emitting layer according to an embodiment of the present invention as an organic layer, and a second electrode. Referring to FIG. 1, the organic light emitting device according to an embodiment of the present invention and a method of preparing the same will be described.

First, a first electrode is formed by depositing or sputtering a high work-function material that is used to form the first electrode on a substrate. The first electrode can be an anode. The substrate, which can be any substrate that is used in conventional organic light emitting devices, may be a glass substrate or a transparent plastic substrate having excellent mechanical strength, thermal stability, transparency, surface smoothness, ease of treatment, and that is waterproof. The material that is used to form the first electrode can be ITO, IZO, $SnO_2$, ZnO, or any transparent material which has high conductivity.

Then, at least one layer of a hole injection layer (HIL) and a hole transport layer (HTL) may be formed on the first electrode as required, even though not shown in FIG. 1.

The HIL can be formed on the first electrode by vacuum deposition, spin coating, casting, langmuir blodgett (LB), or the like.

When the HIL is formed by vacuum deposition, conditions may vary according to a compound that is used to form the HIL, and the structure and thermal properties of the HIL to be formed. In general, however, conditions for vacuum deposition may include a deposition temperature of 100 to 500° C., a pressure of $10^{-8}$ to $10^{-3}$ torr, a deposition speed of 0.01 to 100 Å/sec, and a layer thickness of 10 Å to 5 μm.

When the HIL is formed by spin coating, conditions may vary according to a compound that is used to form the HIL, and the structure and thermal properties of the HIL to be formed. In general, however, conditions for spin coating may include a deposition speed of 2000 to 5000 rpm, and a temperature, during heat-treatment to evaporate the solvent after coating, of 80 to 200° C.

A material that is used to form the HIL is not limited, and may be a phthalocyanine compound, such as a copper phthalocyanine disclosed in U.S. Pat. No. 4,356,429; a star-burst type amine derivative, such as TCTA, m-MTDATA, and m-MTDAPB, disclosed in Advanced Material, 6, p.677 (1994); polyaniline/Dodecylbenzenesulfonic acid (Pani/DBSA); poly(3,4-ethylenedioxythiophene)/Poly(4-styrenesulfonate (PEDOT/PSS): polyaniline/camphor sulfonic acid (Pani/CSA); (polyaniline)/poly(4-styrenesulfonate) (PANI/PSS); or the like, which is a soluble and conductive polymer.

The thickness of the HIL may be in the range of about 100 to 10000 Å, and preferably, in the range of 100 to 1000 Å. When the thickness of the HIL is less than 100 Å, hole injecting capability may be reduced. On the other hand, when the thickness of the HIL is greater than 10000 Å, a driving voltage of the device may increase.

Then, a hole transport layer (HTL) can be formed on the HIL using a vacuum deposition method, a spin coating method, a casting method, LB, or the like. When the HTL is formed by vacuum deposition and spin coating, conditions for deposition and coating are similar to those for formation of the HIL, although conditions for deposition and coating may vary according to a material that is used to form the HTL.

The material that is used to form the HTL is not limited, and can be any material that is conventionally used. For example, the material that is used to form the HTL can be a carbazole derivative, such as N-phenylcarbazole, polyvinylcarbazole; a typical amine derivative having an aromatic condensation ring, such as N,N'-bis(3-methylphenyl)-N,N'-diphenyl-[1,1-biphenyl]-4,4'-diamine(TPD), N,N'-di(naphthalene-1-yl)-N,N'-diphenyl benzidine (α-NPD); or the like.

The thickness of the HTL may be in the range of about 50 to about 1000 Å, and preferably, 100 to about 600 Å. When the thickness of the HTL is less than 50 Å, hole transporting capability may be reduced. On the other hand, when the thickness of the HTL is greater than 1000 Å, the driving voltage of the device may increase.

Then, an emissive layer (EML) can be formed on the HTL if the HTL is formed by vacuum deposition, spin coating, casting, LB, or the like. When the EML is formed by spin coating, conditions for coating are similar to those for formation of the HIL, although conditions for coating may vary according to a material that is used to form the EML.

The EML may include a light emitting polymer according to an embodiment of the present invention, and optionally a host.

The thickness of the EML may be in the range of about 100 to 1,000 Å, and preferably, in the range of 200 to 600 Å. When the thickness of the EML is less than 100 Å, emissive capability may be reduced. On the other hand, when the thickness of the EML is greater than 1,000 Å, the driving voltage of the device may increase.

Then, at least one layer of a hole blocking layer (HBL), an electron transport layer (ETL), and an electron injection layer (EIL) may further be formed between the EML and the second electrode as required, even though not shown in FIG. 1.

The HBL can prevent diffusion of triplet excitons or holes of the EML into a second electrode, etc. The HBL can be formed on the EML using a vacuum deposition method, a spin coating method, a casting method, LB, or the like. When the HBL is formed by vacuum deposition or spin coating, conditions for deposition and coating are similar to those for formation of the HIL, although conditions for deposition and coating conditions may vary according to a material that is used to form the HBL. The material that is used to form the HBL may be, for example, an oxadiazole derivative, a triazole derivative, a phenanthroline derivative, or BCP.

The thickness of the HBL may be in the range of about 50 to 1000 Å, and preferably, in the range of 100 to 300 Å. When the thickness of the HBL is less than 50 Å, hole blocking capability may be reduced. On the other hand, when the thickness of the HBL is greater than 1000 Å, the driving voltage of the device may increase.

Then, the ETL can be formed by vacuum deposition, spin coating, casting, or the like. When the ETL is formed by vacuum deposition and spin coating, conditions for deposition and coating are, in general, similar to those for formation of the HIL, although conditions for deposition and coating conditions may vary according to a material that is used to form the ETL. The material that is used to form the ETL may be a quinoline derivative which stably transports injected electrons from a cathode, in particular, tris(8-quinolinorate) aluminum(Alq$_3$), TAZ, Balq3, or the like which is known in the art.

The thickness of the ETL may be in the range of about 100 to 1000 Å, and preferably, 200 to 500 Å. When the thickness of the ETL is less than 100 Å, electron transporting capability may be reduced. On the other hand, when the thickness of the ETL is greater than 1000 Å, the driving voltage of the device may increase.

Then, the EIL, which is formed of a material allowing easy injection of electrons from a cathode, can be formed on the ETL. The material that is used to form the EIL is not limited.

The material that is used to form the EIL may be LiF, NaCl, CsF, Li$_2$O, BaO, or the like which is known in the art. Conditions for depositing the EIL are, in general, similar to conditions for formation of the HIL, although they may vary according to an embodiment of the material that is used to form the EIL.

The thickness of the EIL may be in the range of about 1 to 100 Å, and preferably, 5 to 50 Å. When the thickness of the EIL is less than 1 Å, electron injecting capability may be reduced. On the other hand, when the thickness of the EIL is greater than 100 Å, the driving voltage of the device may increase.

Finally, a second electrode can be formed on the EIL by vacuum deposition, sputtering, or the like. The second electrode can be used as a cathode. A metal that is used to form the second electrode may be a low work-function metal, an alloy, an electrically conductive compound, or a combination of these. In detail, the metal that is used to form the second electrode may be Li, Mg, Al, Al—Li, Ca, Mg—In, Mg—Ag, or the like. In addition, a transparent cathode formed of ITO or IZO can be used to produce a front surface light emitting device.

Hereinafter, the present invention will be described in more detail by presenting the following examples. The examples are for illustrative purpose, and are not intended to limit the scope of the present invention.

EXAMPLES

Synthesis Example 1

Synthesis of 4-aza-2'7'-dibromo-9,9'-spirobifluorene monomer (Compound 7)

4-aza-2'7'-dibromo-9,9'-spirobifluorene monomer (Compound 7) was synthesized according to Reaction Scheme 2 below:

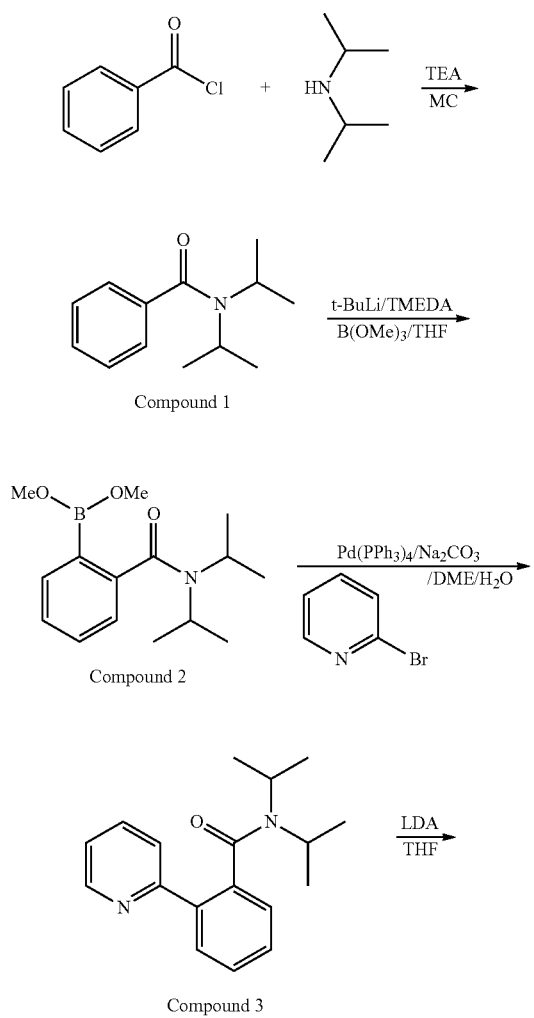

-continued

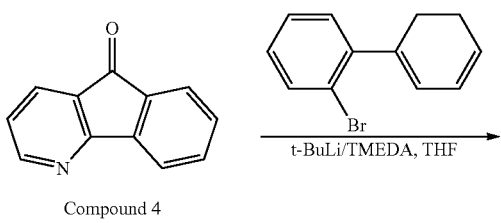

Compound 4

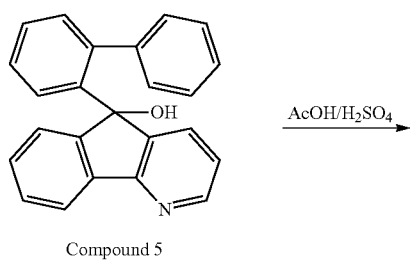

Compound 5

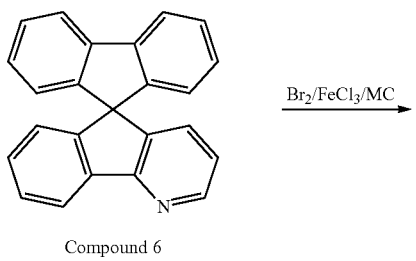

Compound 6

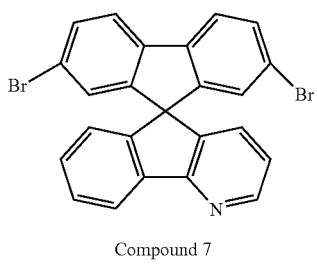 [SMILES: Brc1ccc2c(c1)C1(c3cc(Br)ccc3-2)c2ccccc2-c2ncccc21 ; "Compound 7"]

Compound 7

Synthesis of Compound 1

81 ml (0.58 mole) of N,N-diisopropyl amine and 108 ml (0.78 mole) of triethylamine (TEA) were dissolved in 500 ml of methylene chloride (MC) in a 1,000 ml flask, and cooled to 0° C. 55 g (0.39 mole) of benzoyl chloride was added thereto at 0° C., and the mixture was stirred at room temperature for 2.5 hours. The resultant mixture was washed with a 2N HCl solution, a NaHCO$_3$ solution, and brine, dried using MgSO$_4$, and filtered. The solvent of the filtered solution was removed under reduced pressure in a vacuum to obtain 81.56 g of Compound 1 (Yield: 99%). Compound 1 was identified by $^1$H-NMR.

$^1$H-NMR(300 MHz, CDCl$_3$): δ7.35~7.56(m, 5H), 3.6(d, 2H), 1.1~1.5(m, 12H)

Synthesis of Compound 2

70 g (0.341 mole) of Compound 1 and 56.7 ml (0.375 mole) of tetramethylethylenediamine (TMEDA) were dissolved in 1,300 ml of tetrahydrofuran (THF) in a 3,000 ml 3 neck flask, and cooled to −78° C. 441 ml (0.7497 mole) of 1.7M t-BuLi was added thereto, and the mixture was stirred for 1 hour, and then 116.2 ml (1.023 mole) of trimethyl borate was added thereto, and placed at room temperature overnight. 210 ml of saturated NH$_4$Cl solution and 420 ml of water were added to the resultant mixture, and the mixture was stirred. The resultant was extracted with ethyl acetate (EA), dried using MgSO$_4$, filtered, evaporated to remove the solvent, and vacuum dried to obtain 96.44 g of Compound 2 (Yield: 100%).

Synthesis of Compound 3

96.44 g (94.5 g 0.341 mole) of Compound 2, 29.7 ml (0.310 mole) of 2-bromopyridine, 131.6 g (1.242 mole) of Na$_2$CO$_3$, 7.2 g (2 mole %) of tetrakis-(triphenylphosphan)-palladium (Pd(PPh$_3$)$_4$), 1,000 ml of dimethylether (DME), and 300 ml of H$_2$O were added to a 2 L one neck flask, and the mixture was refluxed for 18 hours, cooled, and filtered using Celite. The solvent of the filtered solution was evaporated and the resultant was extracted using methylene chloride (MC). The resultant was washed with H$_2$O and brine, dried using MgSO$_4$, filtered, and concentrated under reduced pressure. The resultant was added to 1 L of hexane to prepare a slurry, filtered, dried, and purified by column chromatography using a mixed solvent of ethyl acetate (EA) and hexane (1:3) to obtain 72.38 g of Compound 3 (Yield: 82.64%). Compound 3 was identified by $^1$H-NMR.

$^1$H-NMR(300 MHz, CDCl$_3$): δ8.7(d, 1H), 7.8(m, 3H), 7.45(m, 2H), 7.30(m, 2H), 3.5(t, 1H), 3.3(t, 1H), 1.52(d, 3H), 1.33(d, 3H), 0.93(d, 3H), 0.52(d, 3H)

Synthesis of Compound 4

106.5 ml (0.7597 mole) of diisopropylamine was dissolved in 700 ml of THF in a 3 L 3 neck flask, and the mixture was cooled to −78° C. 294.1 ml (0.7352 mole) of 2.5M n-BuLi was added thereto to prepare lithium diisopropylamide (LDA), and the mixture was stirred for 1 hour, and then 69.2 g (0.2451) mole of Compound 3 dissolved in 600 ml of THF was added thereto. After removing bath, the resultant was stirred to room temperature. 1 L of H$_2$O was added thereto at room temperature. The resultant was extracted using EA, washed with H$_2$O and brine, dried using MgSO$_4$, filtered, and concentrated under reduced pressure. The resultant was purified by column chromatography using a mixed solvent of EA and hexane (1:3) to obtain 25.74 g of Compound 4 (Yield: 63.7%). Compound 4 was identified by $^1$H-NMR.

$^1$H-NMR(300 MHz, CDCl$_3$): δ8.6(d, 1H), 7.895(t, 2H), 7.74(d, 1H), 7.60(t, 1H), 7.45(t, 1H), 7.23(m, 1H)

Synthesis of Compound 5

21 g (0.1739 mole) of 2-bromobiphenyl was dissolved in 29.82 ml (0.1970 mole) of TMEDA and 210 ml of THF in a 2 L 3 neck flask, and the mixture was cooled to −78° C. 205 ml (0.3477 mole) of 1.7M t-BuLi was added thereto, and the mixture was stirred for 2 hours. 21 g (0.1159 mole) of Compound 4 dissolved in 210 ml of THF was added thereto. After removing bath, the resultant was stirred to room temperature, and refluxed for one day. 400 ml of $H_2O$ was added thereto at room temperature. The resultant was extracted using EA, washed with $H_2O$ and brine, dried using $MgSO_4$, filtered, and concentrated under reduced pressure. The resultant was heated in 300 ml of hexane to prepare slurry, and stored in a freezer. The resultant was filtered and dried to obtain 30.9 g of Compound 5 (Yield: 79.5%). Compound 5 was identified by $^1$H-NMR.

$^1$H-NMR(300 MHz, $CDCl_3$): δ8.48(d, 1H), 8.00(d, 1H), 7.53(t, 1H), 7.38(t, 1H), 7.2(m, 5H), 6.84(m, 3H), 6.57(t, 2H, 5.89(d, 2H), 3.5(s, 1H)

Synthesis of Compound 6

30.9 g (92.1288 mmole) of Compound 5, 2,000 ml of acetic acid (AcOH), and 31 ml of $H_2SO_4$ were added to a 3 L 3 neck flask, and refluxed and heat-treated for one day. The mixture was cooled to room temperature, added to 13 L of $H_2O$, and stirred. The resultant was filtered, dissolved in MC, and dried using $MgSO_4$. The resultant was filtered and concentrated under reduced pressure to obtain 26.37 g of Compound 6 (Yield: 90.2%). Compound 6 was identified by $^1$H-NMR.

$^1$H-NMR(300 MHz, $CDCl_3$): δ8.55(d, 1H), 8.16(d, 1H), 7.80(t, 2H), 7.45~7.28(m, 3H), 7.22~6.92(m, 5H), 6.7(m, 3H)

Synthesis of Compound 7

26 g (81.92 mmole) of Compound 6, 27.9 g (172.03 mmole) of $FeCl_3$, and 200 ml of MC were added to a 500 ml 2 neck flask, and the mixture was cooled to 0° C. while stirring. 8.73 ml (170.4 mmole) of $Br_2$ dissolved in 50 to 100 ml of MC was dropped to the mixture, stirred for one day, and quenched using 10% $Na_2S_2O_3$ solution. The resultant was washed with $H_2O$ and brine, dried using $MgSO_4$, filtered, concentrated under reduced pressure, and purified by column chromatography using a mixed solvent of EA and hexane (1:9) and a mixed solvent of EA and hexane (1:6) to obtain 27.35 g (pure) and 12 g (crude) of Compound 7 in order. Compound 7 was identified by $^1$H-NMR.

$^1$H-NMR(300 MHz, $CDCl_3$): δ8.63(d, 1H), 8.50(d, 1H), 8.14(d, 1H), 7.69(t, 1H), 7.53(m, 2H), 7.28(m, 2H), 7.06(d, 2H), 6.79(t, 3H)

Synthesis Example 2

Synthesis of Polymer 1

Polymer 1 was synthesized Reaction Scheme 3 below.

Reaction Scheme 3

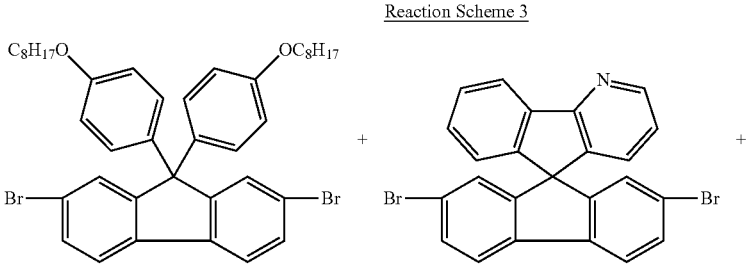

Compound 7

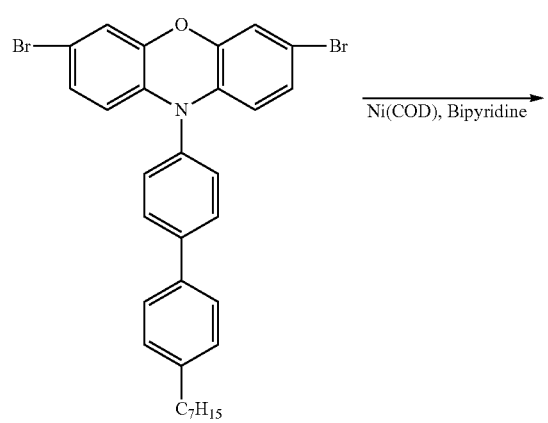

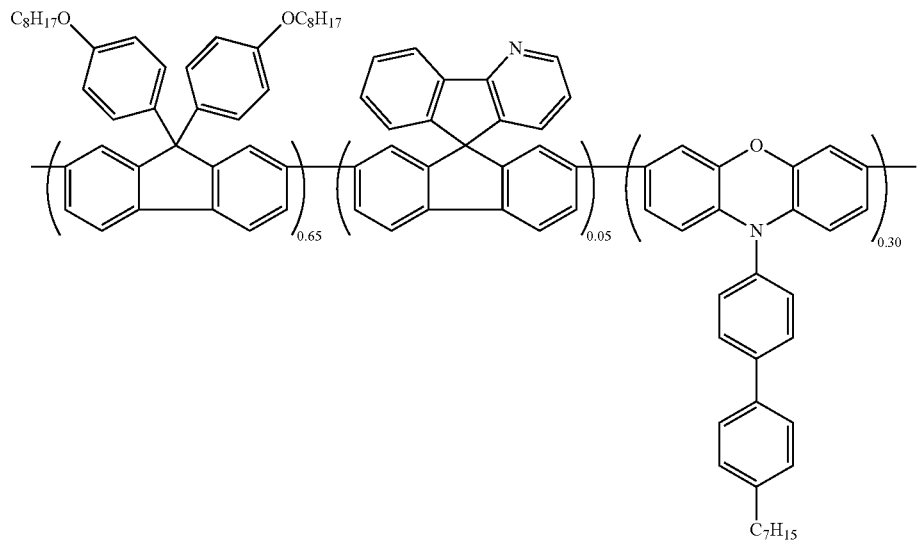

Polymer 1

A Schlenk flask was evacuated several times and refluxed under nitrogen to remove moisture, and 549 mg (1.9 mmol) of Ni(COD)$_2$ and 312 mg (1.9 mmol) of bipyridine were added to a glove box, and then the flask was evacuated several times and refluxed under nitrogen. 5 ml of anhydrous dimethyl formamide (DMF), 0.13 ml (1.2 mmol) of 1,5-cyclo octadiene (COD), and 5 ml of anhydrous toluene were added thereto in a nitrogen atmosphere. The mixture was stirred at 80° C. for 30 minutes. A mixture of 24 mg (0.05 mmol) of Compound 7 obtained in Synthesis Example 1, 476 mg (0.65 mmol) of 9,9-di(4-octyloxyphenyl)-2,7-dibromofluorene, and 177 mg (0.30 mmol) of N-(4-heptylbiphenyl)-2,6-dibromophenoxazine were diluted in 10 ml of toluene, added to the mixture, and stirred. After 20 minutes, 0.1 ml of bromopentafluorobenzene was added thereto, and stirred at 80° C. for about one day.

When the reaction was completed, the mixture was cooled to 60° C., and added to a solution of HCl, acetone, and methanol (1:1:2 v/v) to be precipitated. The precipitate was dissolved in chloroform, precipitated in methanol, and treated using a soxhlet extractor to obtain 0.42 mg of Polymer 1 (Yield: 60%). As a result of GPC analysis of Polymer 1, the weight average molecular weight (Mw) of Polymer 1 was 156,000, the molecular weight distribution (MWD) was 2.3.

Synthesis Example 3

Synthesis of Polymer 2

2-phenylisoquinnoline ligand (Compound 8) was synthesized through Reaction Scheme 4 below:

Reaction Scheme 4

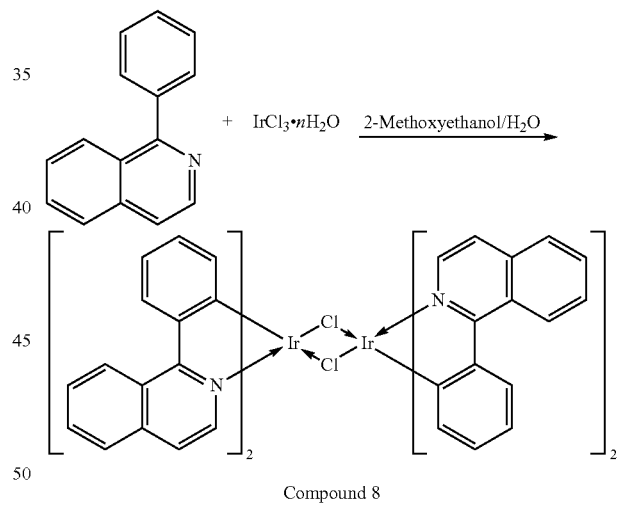

Compound 8

Red powder of Piq dimer ([Ir(Piq)$_2$Cl]$_2$) (Compound 8) was synthesized using 2-phenylisoquinnoline and IrCl$_3$·nH$_2$O with reference to a method disclosed in J. Am. Chem. Soc., 1984,106, 6647-6653 which is incorporated herein by reference.

Then, 200 mg of Polymer 1 synthesized in Synthesis Example 2 were dissolved in 30 mL of toluene in a 250 ml 2 neck flask including a thermometer, a mechanical stirrer and a reflux condenser, and 30 mg K$_2$CO$_3$ and 10 mL of methanol slurry were added thereto. 30 mL of 2-methoxyethanol slurry including 50 mg of [Ir(Piq)$_2$Cl]$_2$ (Compound 8) was added to the reactant mixture, and stirred at 110° C. for 18 hours. When the reaction was completed, the mixture was cooled to room temperature, and the reaction solvent was evaporated under reduced pressure. The resultant was dissolved in toluene and precipitated in methanol, and this process was repeated twice to obtain 160 mg of Polymer 2.

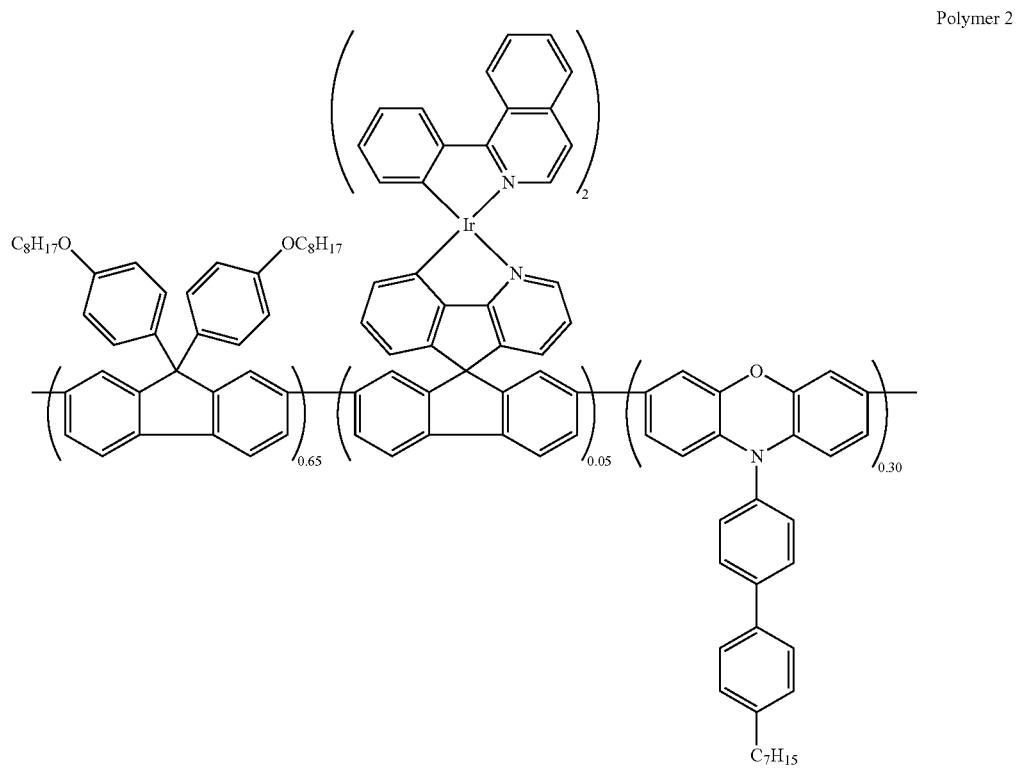

Polymer 2

Synthesis Example 4

Synthesis of Polymer 3

Phenylpyridine ligand (Compound 9) was synthesized through Reaction Scheme 5 below.

Reaction Scheme 5

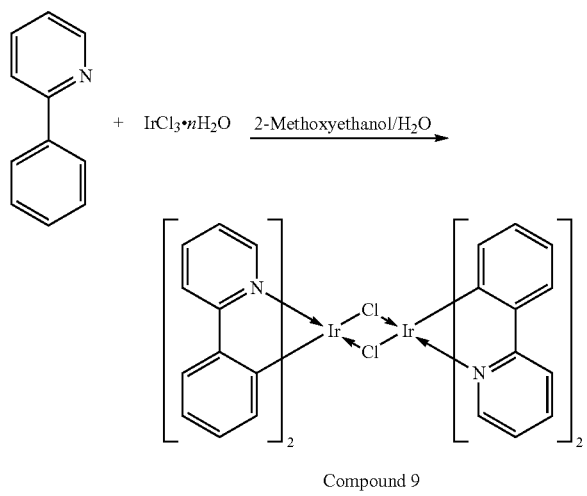

Compound 9

Yellow powder of ppy dimer ([Ir(ppy)$_2$Cl]$_2$)(Compound 9) was synthesized using phenylpyridine and IrCl$_3$.nH$_2$O with reference to a method disclosed in J. Am. Chem. Soc., 1984, 106, 6647-6653.

Then, 100 mg of Polymer 1 synthesized in Synthesis Example 2 was dissolved in 30 ml, of toluene in a 250 ml 2 neck flask including a thermometer, a mechanical stirrer and a reflux condenser, and 30 mg K$_2$CO$_3$ and 10 mL of methanol slurry were added thereto. 30 mL of 2-methoxyethanol slurry including 30 mg of [Ir(ppy)$_2$Cl]$_2$ (Compound 9) was added to the reactant mixture, and stirred at 110° C. for 18 hours. When the reaction was completed, the mixture was cooled to room temperature, and the reaction solvent was evaporated under reduced pressure. The resultant was dissolved in toluene and precipitated in methanol, and this process was repeated twice to obtain 96 mg of Polymer 3.

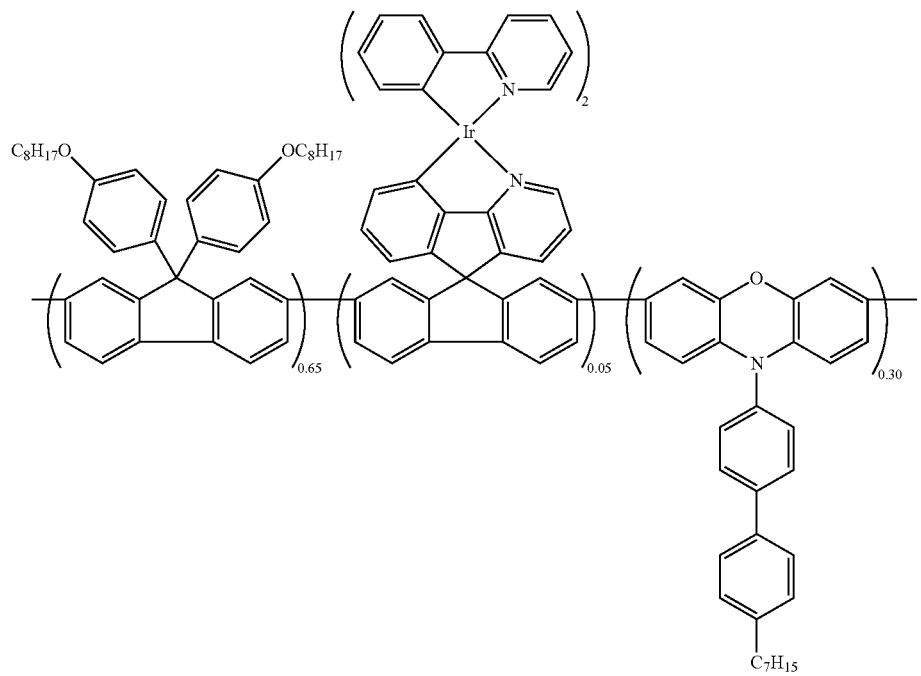

Polymer 3

Evaluation Example 1

Figure 2:
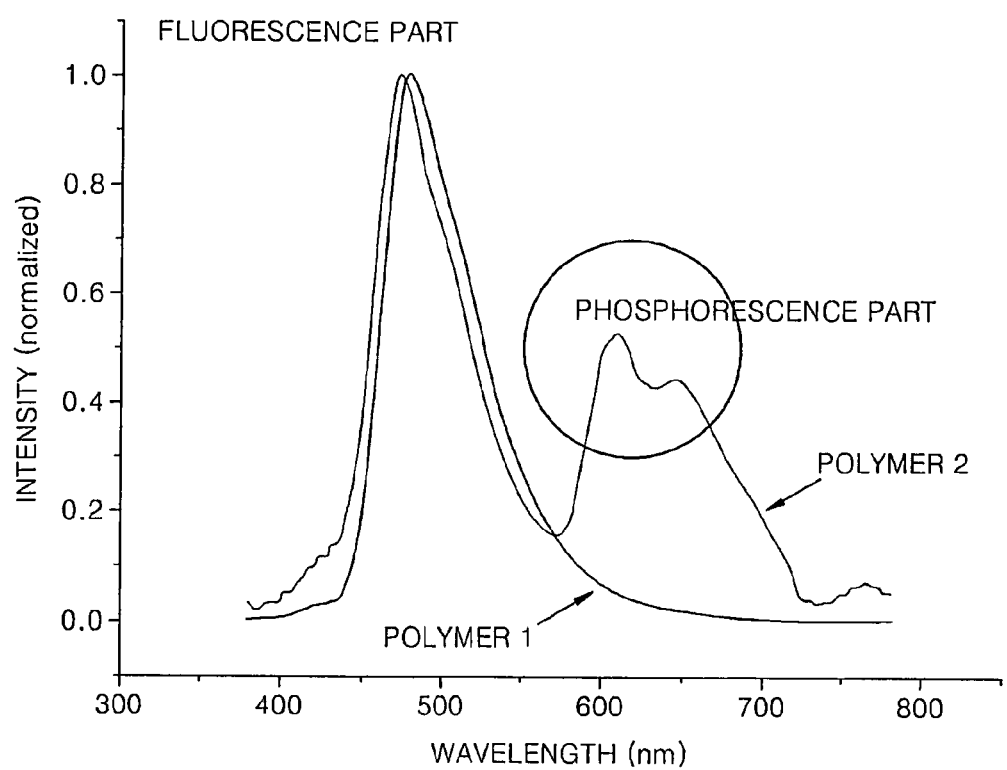
FIG. 2 is a graph illustrating PL spectrum of Polymer 2 prepared according to Synthesis Example 3.

Polymer 1 and Polymer 2 were measured using a photoluminescence (PL) spectrum. First, the PL spectrum of a thin film prepared from Polymer 1 diluted in toluene to a concentration of 1.2 mol % was obtained using an ISC PCd spectrofluorometer having a Xenon lamp. This process was performed on Polymer 2, and the results were shown in FIG. 2. Referring to FIG. 2, Polymer 2 simultaneously emits blue-fluorescence and red-phosphorescence.

Figure 3:
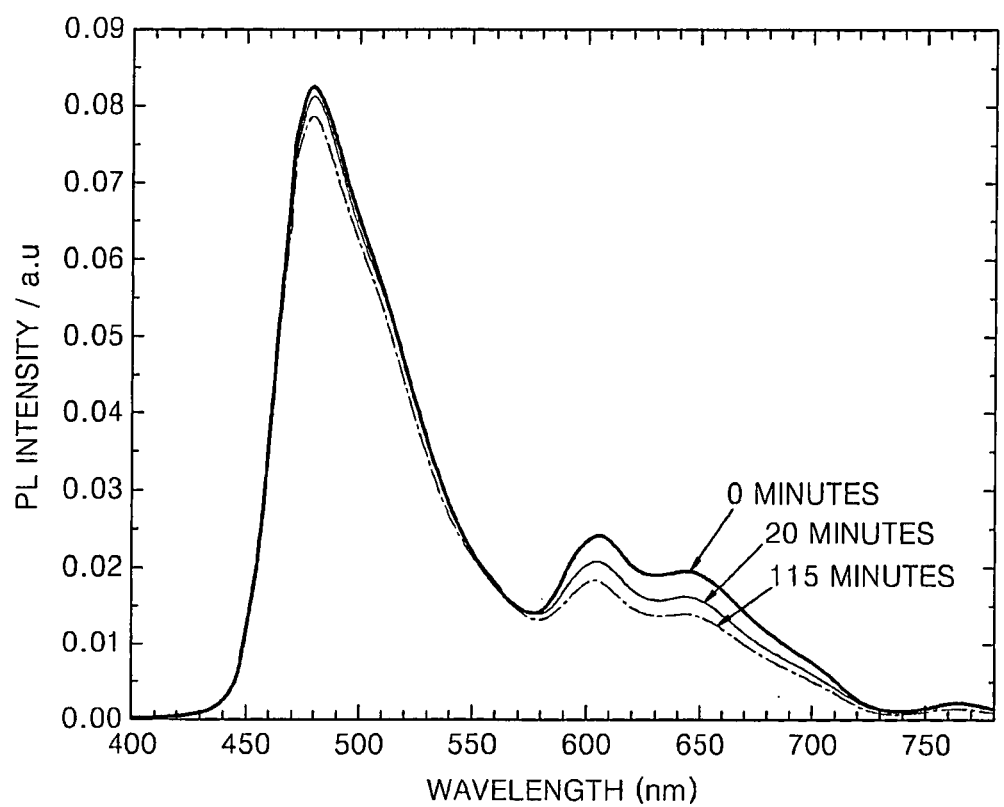
FIG. 3 is a graph illustrating the PL spectrum of Polymer 2 prepared according to Synthesis Example 3 at a number of points of time during continuous usage.

Meanwhile, FIG. 3 is a graph illustrating the PL spectrum of Polymer 2 prepared according to Synthesis Example 3 at a number of points in time during continuous usage. Referring to FIG. 3, there is no significant change in the frequency components of the PL spectrum with time (0 minutes, 20 minutes, and 115 minutes after preparation), and thus a stable color was identified.

Example 1

First, a transparent electrode substrate in which indium-tin oxide (ITO) was coated on a glass substrate was washed, patterned by using a photosensitive resin and an etchant, and again washed. PEDOT (Batron P 4083) obtained from Bayer Co. was coated on the ITO substrate and heat treated at 180° C. for 1 hour to form a HIL with a thickness of 800 Å. A composition that is used to form an EML prepared by dissolving 1 part by weight of Polymer 2 in 99 parts by weight of toluene was spin coated on the HIL and baked in a vacuum oven to evaporate the solvent to form an EML. The composition that is used to form an EML was filtered using a 0.2 mm filter before the spin coating. The EML was formed to have a thickness of 80 nm by controlling the concentration of the composition and the spin coating speed.

Then, an ETL formed using BAlq3, a EIL formed using LiF, and a second electrode formed using Al were sequentially formed on the EML under a vacuum of $4 \times 10^{-6}$ torr or less using a vacuum depositor. The thickness of the layers and layer forming speed were controlled using a crystal sensor.

Evaluation Example 2

Figure 4A:
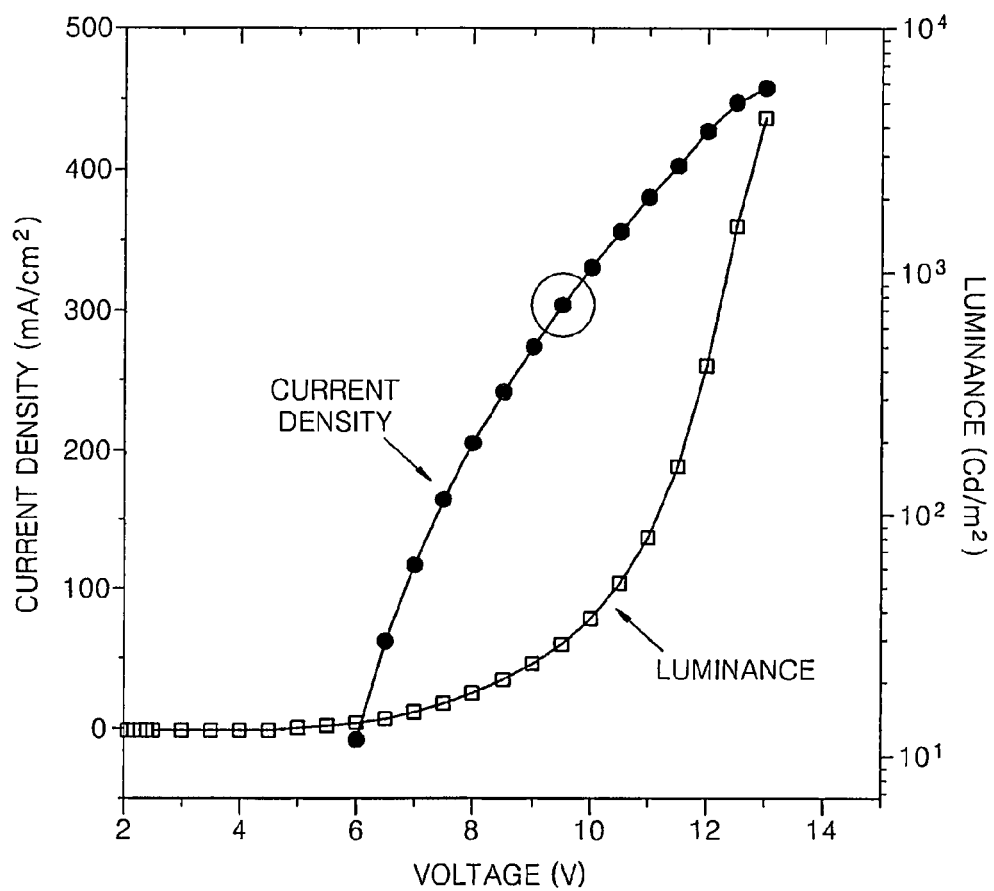
FIG. 4A is a voltage-current density graph of an organic light emitting device prepared according to Example 1.
Figure 4B:
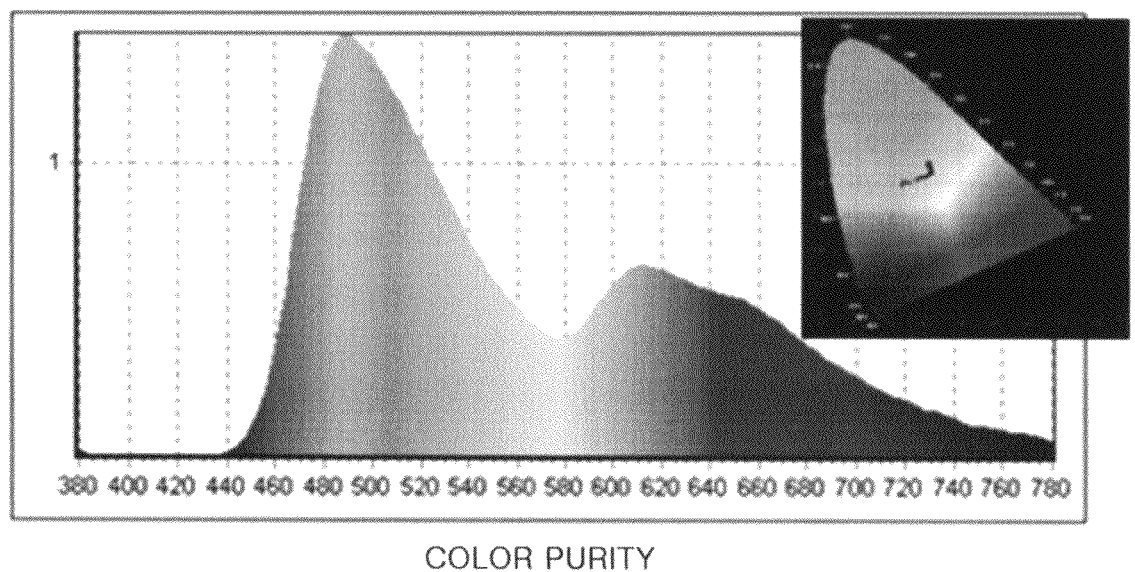
FIG. 4B is a color purity diagram of an organic light emitting device prepared according to Example 1.

Current densities, color purities, luminance, and efficiencies of an organic light emitting device prepared in Example 1 were measured using PR650 (Spectroscan) Source Measurement Unit. As a result, the CIE color coordinate (x, y) of the organic light emitting device of Example 1 was (0.32, 0.42), and a white light emission was identified. Furthermore, efficiency of the organic light emitting device of Example 1 was 2.9 cd/A and the maximum luminance was 6,000 cd/m². More particularly, voltage-current density, and voltage-luminance are shown in FIG. 4A, and color purity of the organic light emitting device of Example 1 are shown in FIG. 4B. FIG. 4B illustrates color coordinate under conditions shown in the circle region of FIG. 4A. Accordingly, the organic light emitting device of Example 1 emits white light, and has excellent efficiency and high luminance.

Figure 5:
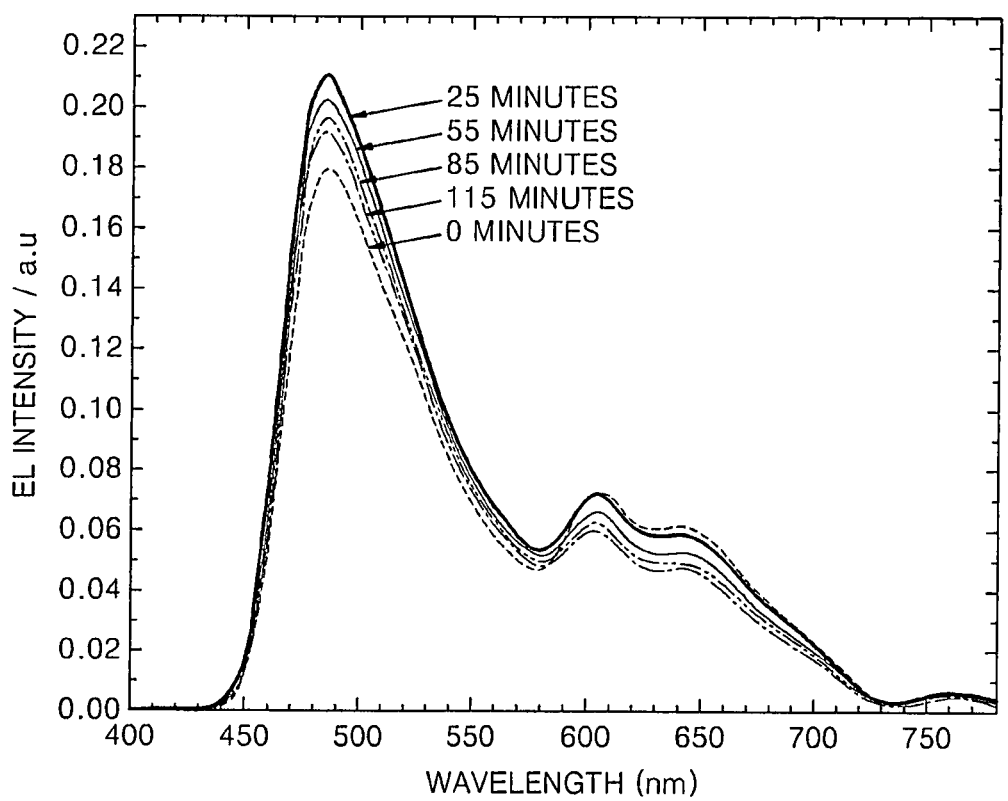
FIG. 5 is a graph illustrating the EL spectrum of an organic light emitting device prepared according to Example 1 at a number of points of time during continuous usage.

An EL spectrum of the organic light emitting device of Example 1 was measured under conditions of 4 mA and 700 cd/m² at a number of points in time during continuous usage (0 minutes, 25 minutes, 55 minutes, 85 minutes, and 115 minutes after turning on), and the results are shown in FIG. 5. Referring to FIG. 5, the organic light emitting device of Example 1 stably emits white light without the EL spectrum changing with time.

The light emitting polymer represented by Formula 1 according to an embodiment of the present invention has high luminance, excellent efficiency, and long lifetime by including a phosphorescence unit and a fluorescence unit, and can emit white light by having the ability to emit light of two or more colors, and thus an organic light emitting device having improved reliability can be obtained.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting device, comprising:

a pair of electrodes; and an organic layer comprising a light emitting polymer between the pair of electrodes, the light emitting polymer comprising a phosphorescence unit and a fluorescence unit, the light emitting polymer represented by Formula 1:

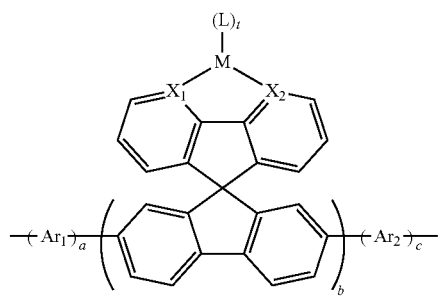

(1)

wherein $X_1$ and $X_2$ are each independently N or C, and at least one of $X_1$ and $X_2$ is N;

M is a bivalent to tetravalent metal atom;

a and b are each a real number of 0.01 to 0.99, c is a real number of 0 to 0.99, and a+b+c=1;

t is 1 or 2; and

L has at least one structure selected from the group consisting of structures represented by Formulae 3A through 3X:

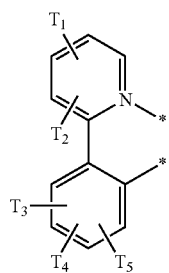

3A

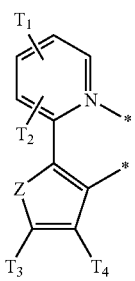

3B

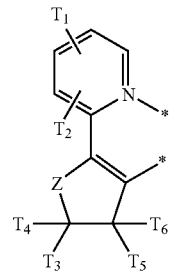

3C

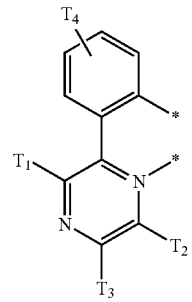

3D

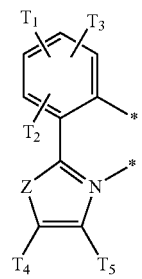

3E

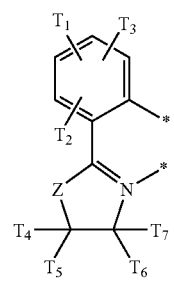

3F

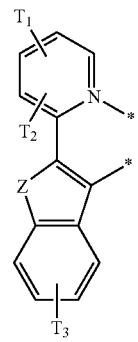

3G

-continued
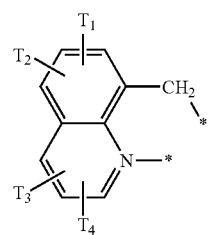 3H
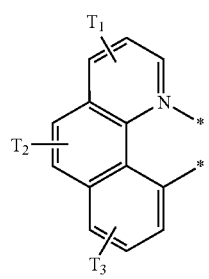 3I
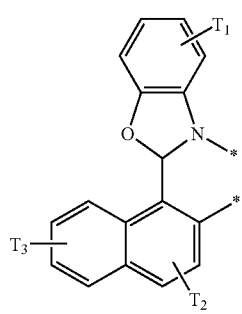 3J
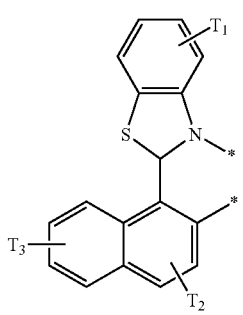 3K
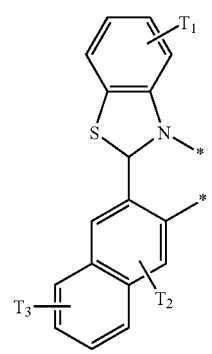 3L
-continued
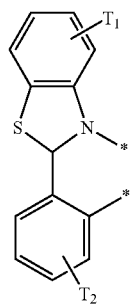 3M
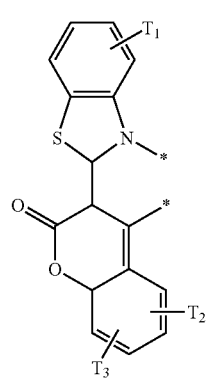 3N
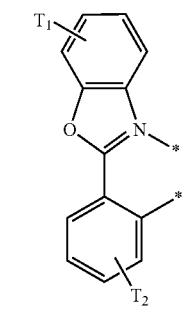 3O
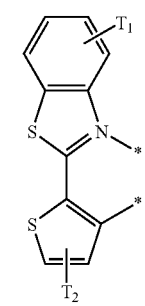 3P
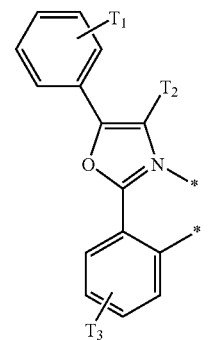 3Q

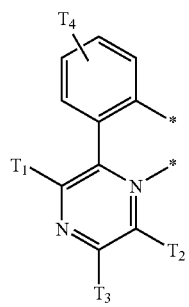

3R

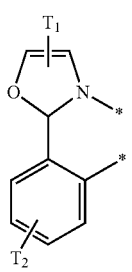

3S

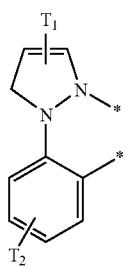

3T

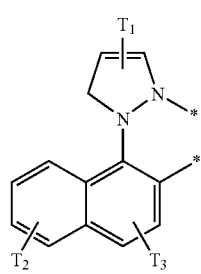

3U

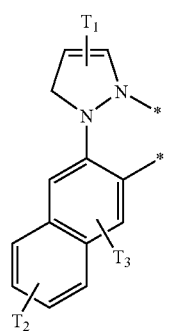

3V

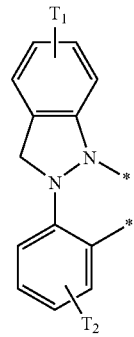

3W

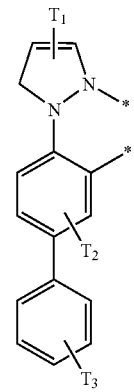

3X wherein Z is S, O or $NT_8$;

$T_1$, $T_2$, $T_3$, $T_4$, $T_5$, $T_6$, $T_7$ and $T_8$ are each independently a hydrogen atom, a halogen atom, —$CF_3$, —CN, —Si($A_1$)($A_2$)($A_3$), a substituted or unsubstituted $C_1$-$C_{12}$ alkyl group, a substituted or unsubstituted $C_2$-$C_{12}$ alkenyl group, a substituted or unsubstituted $C_6$-$C_{20}$ aryl group, a substituted or unsubstituted $C_1$-$C_{12}$ alkoxy group, a substituted or unsubstituted $C_6$-$C_{20}$ aryloxy group or an amino group, and alternatively, at least two of $T_1$, $T_2$, $T_3$, $T_4$, $T_5$, $T_6$, $T_7$ and $T_8$ can be fused to form a 5 to 7 membered aliphatic or aromatic ring;

$A_1$, $A_2$ and $A_3$ are each independently a hydrogen atom, a substituted or unsubstituted $C_1$-$C_{12}$alkyl group, a substituted or unsubstituted $C_2$-$C_{12}$ alkenyl group or a substituted or unsubstituted $C_1$-$C_{12}$ alkoxy group; and

* is a site at which M is bonded; and $Ar_1$ in Formula 1 is a fluorescence unit and has independently at least one structure selected from the group consisting of structures represented by Formulae 5C through 5M, Formulae 5O and 5P, Formula 5S, and $Ar_2$ is a fluorescence unit and is represented by Formula 6:

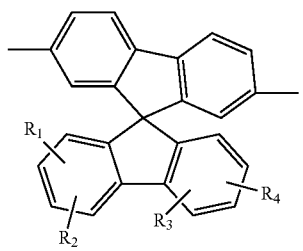

5C

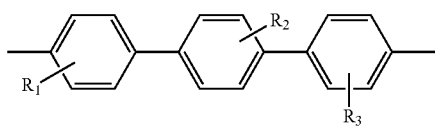
5D

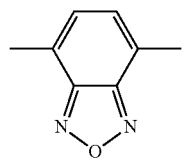
5E

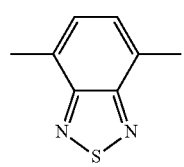
5F

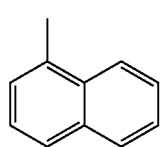
5G

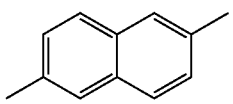
5H

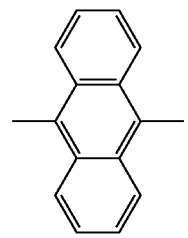
5I

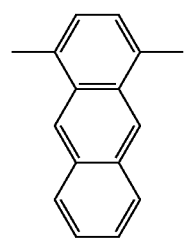
5J

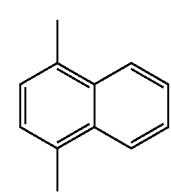
5K

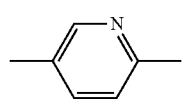
5L

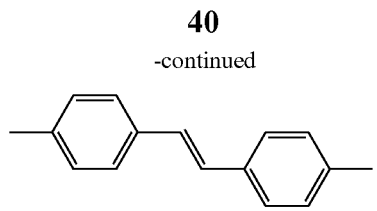
5M

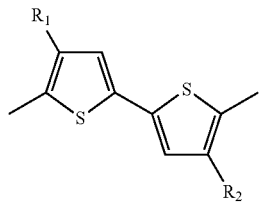
5O

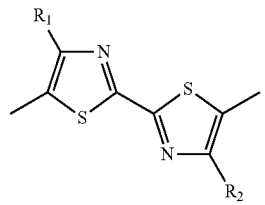
5P

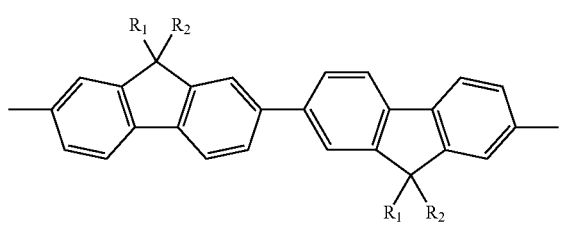
5S

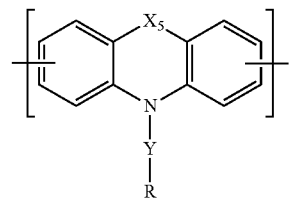
(6)

wherein $R_1$, $R_2$, $R_3$ and $R_4$ are each independently a hydrogen atom, a substituted or unsubstituted $C_1$-$C_{12}$ alkyl group, a substituted or unsubstituted $C_1$-$C_{12}$ alkoxy group, or a substituted or unsubstituted $C_6$-$C_{20}$ aryl group;

$X_5$ is O, S,

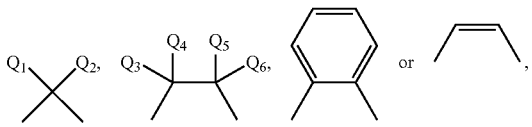

wherein $Q_1$, $Q_2$, $Q_3$, $Q_4$, $Q_5$ and $Q_6$ are each independently a hydrogen atom, a substituted or unsubstituted $C_1$-$C_{20}$ alkyl group or a $C_1$-$C_{20}$ alkoxy group;

Y is a substituted or unsubstituted $C_6$-$C_{20}$ arylene group; and

R is a hydrogen atom, a substituted or unsubstituted $C_1$-$C_{20}$ alkyl group, a substituted or unsubstituted $C_1$-$C_{20}$ alkoxy group, a substituted or unsubstituted $C_3$-$C_{30}$ cycloalkyl group, a substituted or unsubstituted $C_6$-$C_{30}$ aryl group, or a substituted or unsubstituted $C_6$-$C_{30}$ heteroaryl group.

2. The organic light emitting device of claim 1, wherein the organic layer having the light emitting polymer further comprises a host.

3. The organic light emitting device of claim 1, wherein white light is emitted.

4. A light emitting polymer comprising a phosphorescence unit and a fluorescence unit represented by Formula 1:

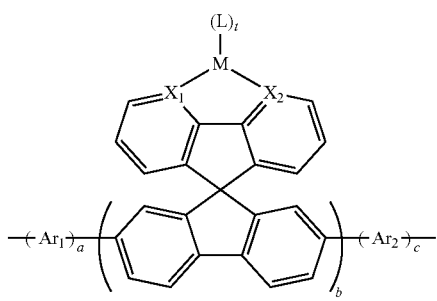
(1)

where $X_1$ is C, $X_2$ is N, M is a bivalent to tetravalent Ir atom, L is Formula 3A, t is 2, $Ar_1$ is Formula 5T, $Ar_2$ is Formula 6, a and b are each a real number of 0.01 to 0.99, c is a real number of 0 to 0.99, and a+b+c=1:

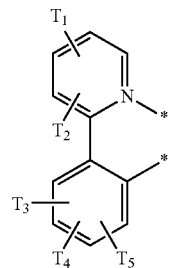
(3A)

where $T_1$ and $T_2$ are a hydrogen atom or substituted or unsubstituted $C_2$-$C_{12}$ alkenyl group, and $T_1$ and $T_2$ can be optionally fused to form a 6-membered aromatic ring, and $T_3$-$T_5$ are hydrogen atoms;

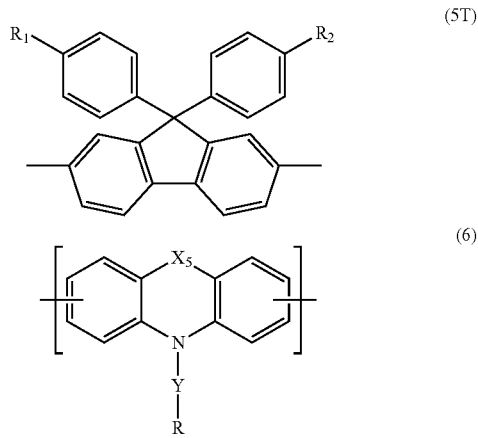

where $R_1$, $R_2$, $R_3$ and $R_4$ are each independently a hydrogen atom, a substituted or unsubstituted $C_1$-$C_{12}$ alkyl group, a substituted or unsubstituted $C_1$-$C_{12}$ alkoxy group, or a substituted or unsubstituted $C_6$-$C_{20}$ aryl group;

X5 is O, S,

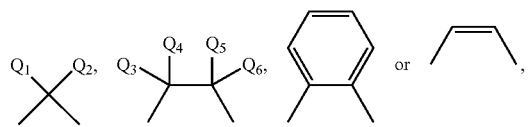

wherein $Q_1$, $Q_2$, $Q_3$, $Q_4$, $Q_5$ and $Q_6$ are each independently a hydrogen atom, a substituted or unsubstituted $C_1$-$C_{20}$ alkyl group or a $C_1$-$C_{20}$ alkoxy group;

Y is a substituted or unsubstituted $C_6$-$C_{20}$ arylene group; and

R is a hydrogen atom, a substituted or unsubstituted $C_1$-$C_{20}$ alkyl group, a substituted or unsubstituted $C_1$-$C_{20}$ alkoxy group, a substituted or unsubstituted $C_3$-$C_{30}$ cycloalkyl group, a substituted or unsubstituted $C_6$-$C_{30}$ aryl group, or a substituted or unsubstituted $C_6$-$C_{30}$ heteroaryl group.

5. An organic light emitting device, comprising a pair of electrodes and an organic layer comprising the light emitting polymer of claim 4 between the pair of electrodes.

* * * * *